US012581596B2

(12) United States Patent
Yao et al.

(10) Patent No.: US 12,581,596 B2
(45) Date of Patent: Mar. 17, 2026

(54) WIRING BOARD, FUNCTIONAL BACKPLANE AND METHOD FOR MANUFACTURING THE SAME

(71) Applicant: BOE TECHNOLOGY GROUP CO., LTD., Beijing (CN)

(72) Inventors: Nianqi Yao, Beijing (CN); Feifei Li, Beijing (CN); Ce Ning, Beijing (CN); Zhengliang Li, Beijing (CN); Hehe Hu, Beijing (CN); Jiayu He, Beijing (CN); Jie Huang, Beijing (CN); Kun Zhao, Beijing (CN); Zhanfeng Cao, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 502 days.

(21) Appl. No.: 17/927,576

(22) PCT Filed: Dec. 31, 2021

(86) PCT No.: PCT/CN2021/143613
§ 371 (c)(1),
(2) Date: Nov. 23, 2022

(87) PCT Pub. No.: WO2023/123328
PCT Pub. Date: Jul. 6, 2023

(65) Prior Publication Data
US 2024/0244747 A1      Jul. 18, 2024

(51) Int. Cl.
*H05K 1/11*        (2006.01)
*H01L 23/498*      (2006.01)
(Continued)

(52) U.S. Cl.
CPC ........ *H05K 1/111* (2013.01); *H01L 23/49838* (2013.01); *H10H 20/857* (2025.01);
(Continued)

(58) Field of Classification Search
CPC .. H05K 1/111; H05K 1/09; H05K 2201/0338; H10H 20/857
(Continued)

(56) References Cited

U.S. PATENT DOCUMENTS 6,519,845 B1   2/2003  Cutting et al.
6,620,720 B1   9/2003  Moyer et al.
(Continued)

FOREIGN PATENT DOCUMENTS

CN      101452988 A  *  6/2009
CN      202095173 U     12/2011
(Continued)

OTHER PUBLICATIONS

PCT International Search Report and Written Opinion (w/ English translation) for corresponding PCT Application No. PCT/CN2021/142667, dated Aug. 12, 2022, 16 pages.
(Continued)

*Primary Examiner* — Andargie M Aychillhum
(74) *Attorney, Agent, or Firm* — Dority & Manning, P.A.

(57)        ABSTRACT

A wiring board includes a base substrate and first connection pads disposed on the base substrate. The first connection pads each include electrical connection layer(s); each electrical connection layer includes a main material layer and protective layer(s) disposed on a side of the main material layer away from the base substrate; the protective layer(s) include a first reference protective layer, which is a protective layer farthest away from the base substrate in the protective layer(s); and a material of the main material layer includes copper. The electrical connection layer(s) include a first electrical connection layer, which is an electrical connection layer farthest away from the base substrate in the electrical connection layer(s); and in protective layer(s) in the first electrical connection layer, at least a material of the
(Continued)

first reference protective layer is capable of forming a first intermetallic compound with a first solder.

19 Claims, 10 Drawing Sheets

(51) Int. Cl.
| | | |
|---|---|---|
| *H10H 20/857* | (2025.01) | |
| *H05K 1/09* | (2006.01) | |
| *H05K 1/181* | (2026.01) | |

(52) U.S. Cl.
CPC .............. *H05K 1/09* (2013.01); *H05K 1/181* (2013.01); *H05K 2201/0338* (2013.01); *H05K 2201/10106* (2013.01); *H05K 2201/10151* (2013.01)

(58) Field of Classification Search
USPC ........................................................ 361/760
See application file for complete search history.

(56) References Cited

U.S. PATENT DOCUMENTS

| | | | |
|---|---|---|---|
| 8,354,009 | B2 | 1/2013 | Han et al. |
| 2002/0076911 | A1 | 6/2002 | Lin |
| 2003/0127701 | A1 | 7/2003 | Tiziani et al. |
| 2004/0166702 | A1 | 8/2004 | Higashi |
| 2006/0222821 | A1 | 10/2006 | Masai |
| 2007/0120233 | A1 | 5/2007 | Tellkamp |
| 2007/0122649 | A1 | 5/2007 | Lee et al. |
| 2007/0232051 | A1 | 10/2007 | Wang et al. |
| 2008/0081157 | A1 | 4/2008 | Schneegans et al. |
| 2008/0096015 | A1 | 4/2008 | Yan |
| 2008/0122086 | A1 | 5/2008 | Tsao et al. |
| 2008/0169539 | A1 | 7/2008 | Fang et al. |
| 2008/0264681 | A1 | 10/2008 | Iwai et al. |
| 2009/0297879 | A1 | 12/2009 | Zeng et al. |
| 2010/0213608 | A1 | 8/2010 | Lau et al. |
| 2010/0301484 | A1 | 12/2010 | Bchir et al. |
| 2011/0006415 | A1* | 1/2011 | Bachman ............ H01L 21/4867 |
| | | | 257/E21.511 |
| 2011/0062580 | A1 | 3/2011 | Liu et al. |
| 2011/0186872 | A1 | 8/2011 | Kim |
| 2011/0220940 | A1 | 9/2011 | Kim |
| 2013/0000978 | A1 | 1/2013 | Choi et al. |
| 2013/0107155 | A1 | 5/2013 | Guo et al. |
| 2013/0241058 | A1 | 9/2013 | Yu et al. |
| 2015/0099316 | A1 | 4/2015 | Ryu et al. |
| 2017/0250171 | A1 | 8/2017 | Yu et al. |
| 2017/0263645 | A1 | 9/2017 | Liu et al. |
| 2017/0358546 | A1 | 12/2017 | Shim et al. |
| 2019/0114957 | A1 | 4/2019 | Fan et al. |
| 2019/0229446 | A1* | 7/2019 | Kim ........................ H01R 12/52 |
| 2020/0035147 | A1 | 1/2020 | Ban et al. |
| 2020/0168461 | A1 | 5/2020 | Wang et al. |
| 2021/0043817 | A1 | 2/2021 | Liang et al. |
| 2021/0125566 | A1 | 4/2021 | Yang et al. |
| 2021/0143134 | A1 | 5/2021 | Wang |
| 2021/0223631 | A1 | 7/2021 | Ban et al. |
| 2021/0242146 | A1 | 8/2021 | Arvin et al. |
| 2021/0294158 | A1 | 9/2021 | Wang et al. |
| 2021/0358896 | A1 | 11/2021 | Lee et al. |
| 2021/0359182 | A1 | 11/2021 | Cao et al. |
| 2022/0181245 | A1* | 6/2022 | Ko ..................... H01L 23/49811 |
| 2024/0234658 | A1 | 7/2024 | He et al. |
| 2024/0260185 | A1 | 8/2024 | Zhang et al. |

FOREIGN PATENT DOCUMENTS

| | | |
|---|---|---|
| CN | 202159705 U | 3/2012 |
| CN | 102437135 A | 5/2012 |
| CN | 103904172 A | 7/2014 |
| CN | 104201121 A | 12/2014 |
| CN | 104244566 A | 12/2014 |
| CN | 104561943 A | 4/2015 |
| CN | 104810457 A | 7/2015 |
| CN | 105578709 A | 5/2016 |
| CN | 206471352 U | 9/2017 |
| CN | 107768343 A | 3/2018 |
| CN | 109449087 A | 3/2019 |
| CN | 110890323 A | 3/2020 |
| CN | 210837765 U | 6/2020 |
| CN | 111862886 A | 10/2020 |
| CN | 112186079 A | 1/2021 |
| CN | 112951791 A | 6/2021 |
| CN | 113066834 A | 7/2021 |
| CN | 113096549 A | 7/2021 |
| CN | 113629079 A | 11/2021 |
| CN | 113964112 A | 1/2022 |
| CN | 113966076 A | 1/2022 |
| CN | 114509884 A | 5/2022 |
| CN | 114823608 A | 7/2022 |
| CN | 114843390 A | 8/2022 |
| EP | 2276063 A2 | 1/2011 |
| JP | H08125310 A | 5/1996 |
| JP | 2005322703 A | 11/2005 |
| JP | 2009065116 A | 3/2009 |
| JP | 2009253275 A | 10/2009 |
| JP | 2011159870 A | 8/2011 |
| JP | 2014103143 A | 6/2014 |
| JP | 2016146377 A | 8/2016 |
| KR | 20130068112 A | 6/2013 |
| KR | 20210038512 A | 4/2021 |
| KR | 10-2021-0133777 A | 11/2021 |
| TW | 201345710 A | 11/2013 |
| TW | 201520381 A | 6/2015 |
| WO | WO2008092708 A1 | 8/2008 |
| WO | WO2009145461 A2 | 12/2009 |
| WO | WO2009145462 A2 | 12/2009 |
| WO | WO2020153770 A1 | 7/2020 |

OTHER PUBLICATIONS

PCT International Search Report and Written Opinion (w/ English translation) for corresponding PCT Application No. PCT/CN2022/077542, dated Oct. 10, 2022, 16 pages.

PCT International Search Report and Written Opinion (w/ English translation) for corresponding PCT Application No. PCT/CN2022/088130, dated Dec. 19, 2022, 18 pages.

PCT International Search Report and Written Opinion (w/ English translation) for corresponding PCT Application No. PCT/CN2022/128740, dated Jul. 3, 2023, 13 pages.

Taiwanese Office Action (w/ English translation) for corresponding Application No. 112113817, dated Dec. 19, 2023, 27 pages.

Extended European Search Report for corresponding EP Application No. 21969681.2, dated Sep. 11, 2024, 11 pages.

Chinese Office Action (w/ English translation) for corresponding CN Application No. 202111239110.X, dated Nov. 22, 2024, 14 pages.

Extended European Search Report in corresponding EP Application No. 22937855.9, dated Feb. 19, 2025, in 7 pgs.

Extended European Search Report in corresponding EP Application No. 22955997.6, dated Mar. 12, 2025, in 8 pgs.

Non-Final Office Action in U.S. Appl. No. 18/552,754, dated Mar. 12, 2025, in 10 pgs.

U.S. Non-Final Office Action received in corresponding U.S. Appl. No. 17/927,792, dated Jul. 2, 2025, 19 pages.

Chinese Office Action (with English translation) received in corresponding Application No. CN 202210389051.2, dated Jun. 18, 2025, 15 pages.

Japanese Office Action (with English translation) for corresponding Application No. JP2023-579657, dated Nov. 11, 2025, 20 pages.

Chinese First Office Action (with English translation) for corresponding Application No. CN 202180004327.4, dated Sep. 18, 2025, 20 pages.

(56) References Cited

OTHER PUBLICATIONS

Jin-Du, "The brief summary of the finish in PCB soldered tray",
Special Plating PCB Coating, No. 8, 2016, 10 pages.

* cited by examiner

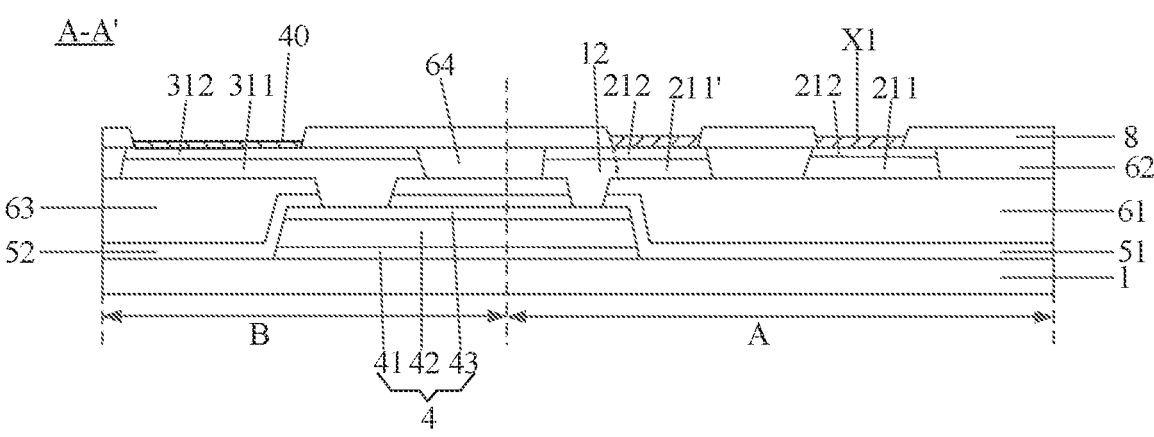
FIG. 5
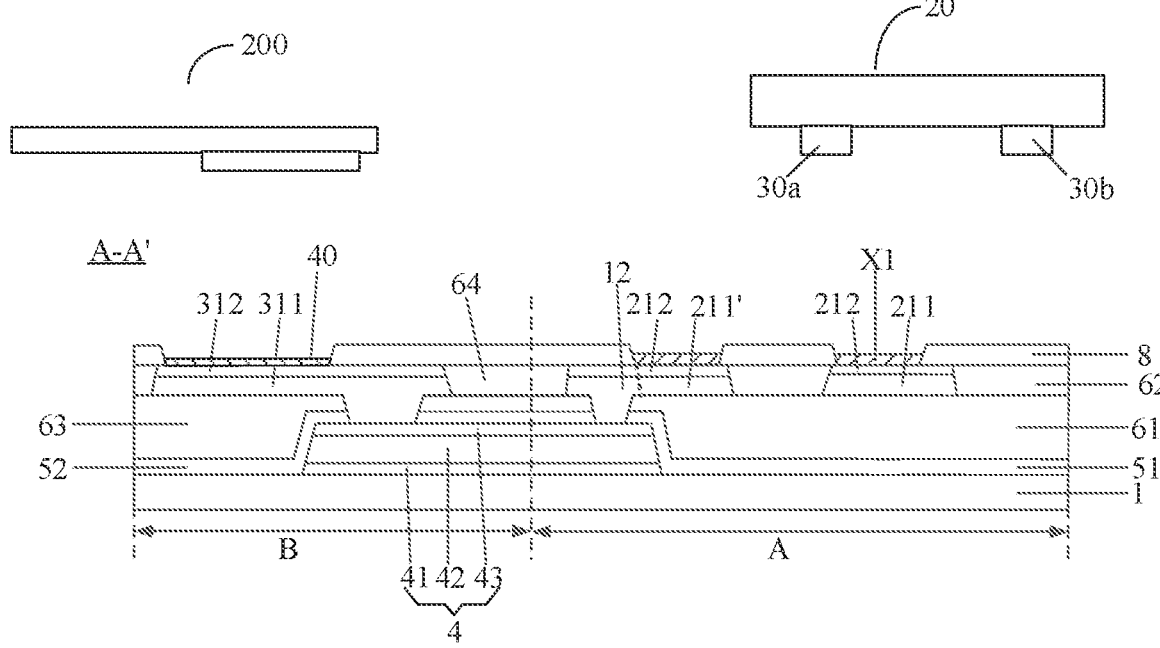
FIG. 6
FIG. 7A

WIRING BOARD, FUNCTIONAL BACKPLANE AND METHOD FOR MANUFACTURING THE SAME

CROSS-REFERENCE TO RELATED APPLICATION

This application is a national phase entry under 35 USC 371 of International Patent Application No. PCT/CN2021/143613, filed on Dec. 31, 2021, which is incorporated herein by reference in its entirety.

TECHNICAL FIELD

The present disclosure relates to the field of lighting and display technologies, and in particular, to a wiring board, a functional backplane and a method for manufacturing the same.

BACKGROUND

In a light-emitting diode (LED), inorganic semiconductor materials are used to manufacture a PN junction, and carriers are driven by an electric field to be recombined in the PN junction to achieve light emission. The LED has higher light emission luminance and response speed than an organic light-emitting diode (OLED) light-emitting device.

SUMMARY

In an aspect, a wiring board is provided. The wiring board includes a base substrate and a plurality of first connection pads. The plurality of first connection pads are disposed on the base substrate. The plurality of first connection pads each include at least one electrical connection layer; each electrical connection layer includes a main material layer and at least one protective layer disposed on a side of the main material layer away from the base substrate; the at least one protective layer includes a first reference protective layer, the first reference protective layer is a protective layer farthest away from the base substrate in the at least one protective layer; and a material of the main material layer includes copper. The at least one electrical connection layer includes a first electrical connection layer; the first electrical connection layer is an electrical connection layer farthest away from the base substrate in the at least one electrical connection layer; and in at least one protective layer included in the first electrical connection layer, at least a material of the first reference protective layer is capable of forming a first intermetallic compound with a first solder.

In some embodiments, the material of the first reference protective layer included in the first electrical connection layer is a metal simple substance or a metal alloy.

In some embodiments, the metal simple substance includes any one of Cu, Ni, Fe, Ag and Au. The metal alloy includes a nickel alloy or a copper alloy.

In some embodiments, the nickel alloy includes any one of a nickel-vanadium alloy, a nickel-aluminum alloy, a nickel-tungsten alloy, a copper-nickel-titanium alloy and a copper-nickel-aluminum alloy.

In some embodiments, a thickness or a material of the at least one protective layer included in the first electrical connection layer is configured to block diffusion of the first solder to a main material layer included in the first electrical connection layer.

In some embodiments, in a case where the material of the first reference protective layer included in the first electrical connection layer includes copper or a copper-nickel alloy, a thickness of the first reference protective layer included in the first electrical connection layer is in a range of 300 Å to 600 Å, inclusive. In a case where the material of the first reference protective layer included in the first electrical connection layer does not include copper, the thickness of the first reference protective layer included in the first electrical connection layer is in a range of 300 Å to 3000 Å, inclusive.

In some embodiments, a diffusion depth of the first solder in the at least one protective layer included in the first electrical connection layer is greater than or equal to the thickness of the first reference protective layer included in the first electrical connection layer.

In some embodiments, the at least one protective layer included in the first electrical connection layer includes at least two protective layers, the at least two protective layers include the first reference protective layer and a second reference protective layer, the second reference protective layer is located between the first reference protective layer and the base substrate; and a material of the second reference protective layer is capable of forming another first intermetallic compound with the first solder, or the material of the second reference protective layer is not capable of forming the another first intermetallic compound with the first solder.

In some embodiments, the material of the second reference protective layer is capable of forming the another first intermetallic compound with the first solder. Materials of the at least two protective layers are different, or a thickness of at least one protective layer in the at least two protective layers is greater than 500 Å, or a sum of thicknesses of the at least two protective layers is greater than 500 Å.

In some embodiments, in a case where the materials of the at least two protective layers are different, elements included in the at least two protective layers are different; or the at least two protective layers include same elements and a ratio of the elements is different; or the at least two protective layers include same base elements and a ratio of the base elements is same, and the at least one protective layer in the at least two protective layers further includes a dopant material doped in the base elements included in the at least one protective layer in the at least two protective layers.

In some embodiments, in a direction pointing from a first connection pad in the plurality of first connection pads to the base substrate, a diffusion depth of the first solder in the at least two protective layers per unit time gradually decreases; and/or melting points of the materials of the at least two protective layers gradually increase.

In some embodiments, in a direction pointing from a first connection pad in the plurality of first connection pads to the base substrate, a ratio of an element capable of forming the first intermetallic compound with the first solder in the at least two protective layers gradually decreases.

In some embodiments, in a direction pointing from a first connection pad in the plurality of first connection pads to the base substrate, thicknesses of the at least two protective layers gradually increase.

In some embodiments, a thickness of the second reference protective layer is greater than or equal to 1000 Å and less than or equal to 30000 Å, and a thickness of the first reference protective layer is greater than or equal to 300 Å and less than or equal to 1000 Å.

In some embodiments, a diffusion depth of the first solder in the at least one protective layer included in the first electrical connection layer is greater than or equal to a thickness of the first reference protective layer included in the first electrical connection layer, and less than or equal to a sum of the thickness of the first reference protective layer included in the first electrical connection layer and a thickness of the second reference protective layer.

In some embodiments, the at least one electrical connection layer further includes a second electrical connection layer, the second electrical connection layer is located between the first electrical connection layer and the base substrate; and a material of a first reference protective layer included in the second electrical connection layer is capable of forming another first intermetallic compound with the first solder, or the material of the first reference protective layer included in the second electrical connection layer is not capable of forming the another first intermetallic compound with the first solder.

In some embodiments, the material of the first reference protective layer included in the second electrical connection layer is capable of forming the another first intermetallic compound with the first solder; and a thickness of the first reference protective layer included in the second electrical connection layer is greater than a thickness of the first reference protective layer included in the first electrical connection layer.

In some embodiments, the thickness of the first reference protective layer included in the second electrical connection layer is greater than or equal to 1000 Å and less than or equal to 30000 Å, and the thickness of the first reference protective layer included in the first electrical connection layer is greater than or equal to 300 Å and less than or equal to 1000 Å.

In some embodiments, a diffusion depth of the first solder in the at least one electrical connection layer is greater than or equal to a thickness of the first reference protective layer included in the first electrical connection layer, and less than or equal to a sum of a thickness of the first electrical connection layer and a thickness of the first reference protective layer included in the second electrical connection layer.

In some embodiments, the wiring board further includes a plurality of second connection pads disposed on the base substrate. The plurality of second connection pads are configured to be electrically connected to a circuit board.

In another aspect, a functional backplane is provided. The functional backplane includes: the wiring board as described above, the first solder and at least one electronic component. Each electronic component includes pins, and the electronic component being soldered to first connection pads in the plurality of first connection pads through the pins and the first solder. The first solder forms the first intermetallic compound with at least the first reference protective layer included in the first electrical connection layer in each of the first connection pads.

In some embodiments, the at least one electronic component includes at least one first electronic component; in a first connection pad soldered to a pin included in the at least one first electronic component, a surface, away from the base substrate, of the first reference protective layer included in the first electrical connection layer has a depression; the depression is provided with a second solder therein, and the second solder forms the first intermetallic compound with at least a sidewall of the depression.

In some embodiments, the at least one electrical connection layer further includes a third electrical connection layer, and the third electrical connection layer is an electrical connection layer closest to the base substrate in the at least one electrical connection layer.

A portion of the first connection pad located on a side of a bottom of the depression includes at least a portion included in the third electrical connection layer in the first connection pad, and the portion included in the third electrical connection layer includes at least a portion of a main material layer included in the third electrical connection layer.

In yet another aspect, a method for manufacturing a functional backplane is provided, which includes:

fabricating a wiring board, the wiring board including a base substrate and a plurality of first connection pads; the plurality of first connection pads being formed on the base substrate; the plurality of first connection pads each including at least one electrical connection layer, and each electrical connection layer including a main material layer and at least one protective layer disposed on a side of the main material layer away from the base substrate; the at least one protective layer including a first reference protective layer, and the first reference protective layer being a protective layer farthest away from the base substrate in the at least one protective layer; a material of the main material layer including copper; the at least one electrical connection layer including a first electrical connection layer, and the first electrical connection layer being an electrical connection layer farthest away from the base substrate in the at least one electrical connection layer; and in at least one protective layer included in the first electrical connection layer, at least a material of the first reference protective layer being capable of forming a first intermetallic compound with a first solder;

providing at least one electronic component, each electronic component including pins; and soldering the electronic component to first connection pads in the plurality of first connection pads through the pins and the first solder, wherein the first solder forms the first intermetallic compound with at least the first reference protective layer included in the first electrical connection layer in each of the first connection pads, and the first solder forms a second intermetallic compound with a pin in the pins.

In some embodiments, soldering the electronic component to the first connection pads in the plurality of first connection pads through the pins and the first solder includes:

providing the first solder between the pins included in each electronic component and the first connection pads, and making the first solder react with the first connection pads and the pins, so as to solder the electronic component to the first connection pads through the pins and the first solder.

In some embodiments, in a case where the at least one electronic component includes a plurality of electronic components, and the plurality of electronic components include at least one first electronic component, the manufacturing method further includes:

detecting states of connections between the plurality of electronic components and the plurality of first connection pads; and if a state of a connection between a second electronic component and a first connection pad does not meet a requirement, replacing the second electronic component with a first electronic component in the at least one first electronic component.

In some embodiments, replacing the second electronic component with the first electronic component in the at least one first electronic component includes:

removing the second electronic component to form a depression on a surface of the first connection pad away from the base substrate; and providing a second solder in the depression, and soldering a pin included in the first electronic component to the first connection pad through the second solder, wherein the second solder forms the first intermetallic compound with at least a sidewall of the depression.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on an actual size of a product, an actual process of a method and an actual timing of a signal involved in the embodiments of the present disclosure.

FIG. 5 is a section view of the first wiring layer and the first connection pads in FIG. 4 taken along the line AA', in accordance with some embodiments;

FIG. 6 is sectional view illustrating a connection between a wiring board and both a circuit board and an electronic component, in accordance with some embodiments;

FIG. 7A is another structural diagram illustrating a connection between a first connection pad and a pin, in accordance with some embodiments;

DETAILED DESCRIPTION

Figure 1:
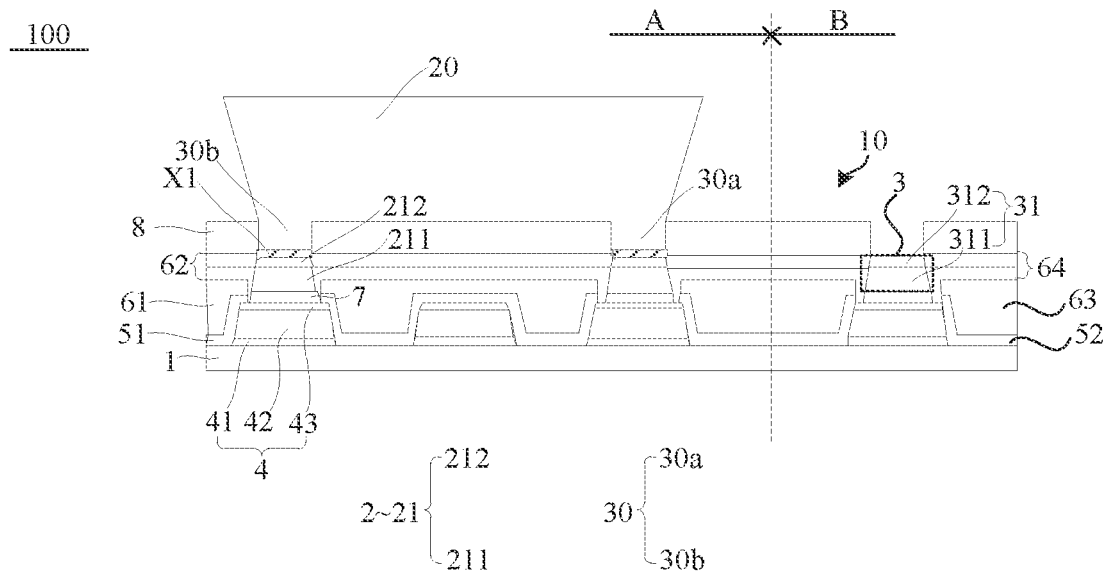
FIG. 1 is a sectional view illustrating a structure of a functional backplane, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

The phrase "at least one of A, B and C" has the same meaning as the phrase "at least one of A. B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein means an open and inclusive expression, which does not exclude apparatuses that are applicable to or configured to perform additional tasks or steps.

Some embodiments of the present disclosure provide a light-emitting apparatus. The light-emitting apparatus includes a functional backplane. Of course, the light-emitting apparatus may further include other components. For example, the other components may include a circuit for providing electrical signals to the functional backplane to drive the functional backplane to emit light. The circuit may be referred to as a control circuit. The other components may also include a circuit board electrically connected to the functional backplane and/or an integrated circuit (IC) electrically connected to the functional backplane.

In some embodiments, the light-emitting apparatus may be a lighting apparatus. In this case, the light-emitting apparatus is used as a light source to achieve a lighting function. For example, the light-emitting apparatus may be a backlight module in a liquid crystal display device, or a lamp for internal or external lighting, or a lamp in various signal lamps.

In some other embodiments, the light-emitting apparatus may be a display device. In this case, the functional backplane is a display substrate, and is used to achieve a function of displaying images (i.e., pictures). The light-emitting apparatus may include a display or a product including the display. The display may be a flat panel display (FPD), a micro display, etc. If classified according to whether a user can see a scene behind the display, the display may be a transparent display or an opaque display. If classified according to whether the display can be bent or curled, the display may be a flexible display or a common display (which may be referred to as a rigid display). For example, the product including the display may include: a computer display, a television, a billboard, a laser printer with a display function, a telephone, a mobile phone, a personal digital assistant (PDA), a laptop computer, a digital camera, a portable camcorder, a viewfinder, a vehicle, a large-area wall, a screen in a theater or a sign in a stadium.

The surface mounted technology (SMT) is one of the most popular technologies and processes in electronic assembly industries. SMT is a technology in which an electronic component having pins is placed on a surface of a base substrate having circuits and connection pads (also referred to as pads), and the electronic component is soldered and assembled to the base substrate through a reflow soldering manner or dip soldering manner. In order to complete a fixed connection between the electronic component and the connection pad, it needs to provide solder on the connection pad, which is to be electrically connected to the electronic component, of the base substrate, or to provide solder on the pin of the electronic component, and then the electronic component is aligned with and in contact with the connection pad. For example, at a high temperature in a range of 230° C. to 260° C., inclusive, the solder is melted to get good wetting, and is then rapidly cooled down to achieve the fixed connection or soldering of the electronic component and the connection pad. The connection pad is generally made of copper. However, copper is prone to be oxidized. Therefore, a surface treatment for the connection pad is needed to prevent copper from being oxidized. A manner of the surface treatment for the connection pad includes forming a copper alloy layer on a surface of the connection pad to prevent copper from being oxidized. In this way, the electronic component is directly soldered to the copper alloy layer through the solder. However, the inventors of the present disclosure have found that, in the reflow soldering process, an intermetallic compound (IMC) is formed by the solder with the copper alloy layer and with the connection pad, and a thickness and composition of the intermetallic compound are in a functional relationship with a time, a temperature and an application condition of the soldering process; in addition, internal stress at a material junction varies according to the thickness and composition of the intermetallic compound (in general, as the thickness of the intermetallic compound increases, the internal stress gradually increases), so that a phenomenon of embrittlement and even breaking occurs at a position (solder joint) where the electronic component is in contact with the connection pad. As a result, a connection intensity and reliability of the two are affected.

In the reflow soldering process, the intermetallic compound will be rapidly formed by the solder with the copper alloy layer and with the connection pad. The solder is in direct contact with the copper alloy layer and the connection pad, and copper in the copper alloy layer and the connection pad forms "temporarily stable" intermetallic compounds of a $Cu_xSn_y$ series with tin in the solder, where x in $Cu_xSn_y$ takes a value from 3, 4, 5, and 6, and y in $Cu_xSn_y$ takes a value from 2, 3, 4, and 5. Thicknesses and thickness ratios of these intermetallic compounds of the $Cu_xSn_y$ series vary with a temperature, a time, an environment and a using condition in the soldering process. The $Cu_3Sn_2$ intermetallic compound is located in a region farthest away from the solder, and the $Cu_6Sn_5$ intermetallic compound is located in a region closest to the solder. The $Cu_3Sn_2$ intermetallic compound has poor solderability, and the $Cu_6Sn_5$ intermetallic compound has solderability and a small thickness, which results in a low connection intensity and poor reliability at the solder joint.

In addition, in a case where there is pseudo soldering or soldering position offset when the electronic component is soldered, the electronic component needs to be removed by applying a lateral shear force and then firmly re-soldered at a correct position. In a process of removing the electronic component, the connection pad may be damaged, so that the connection pad cannot be soldered to the electronic component again.

Some embodiments of the present disclosure provide a functional backplane 100. As shown in FIG. 1, the functional backplane 100 includes a wiring board 10 and at least one electronic component 20 disposed on the wiring board 10. Each electronic component 20 includes pins 30, and the electronic component 20 is electrically connected to the wiring board 10 through the pins 30. The electronic component 20 may include a micro light-emitting diode, a micro chip, a micro sensor, a micro driver, which will not be limited here.

In an example where the electronic component 20 has two pins 30, the pins 30 may include a cathode pin 30a and an anode pin 30b. The wiring board 10 includes a base substrate 1 and a plurality of first connection pads 2. The base substrate 1 has a device area A, and the plurality of first connection pads 2 are disposed on the base substrate 1 and located in the device area A. The electronic component 20 is electrically connected to first connection pads 2 through the pins 30 (the cathode pin 30*a* and the anode pin 30*b*) and first solders X1 (including an alloy whose base material is tin, such as a tin-silver-copper alloy), thereby achieving an electrical connection between the electronic component 20 and the wiring board 10.

For example, the electronic component 20 is the micro light-emitting diode. The micro light-emitting diode refers to a light-emitting diode with a dimension in a range of about 50 microns to about 500 microns, inclusive.

As for backlight applications, in a case where the electronic component 20 is the micro light-emitting diode, by arranging a plurality of micro light-emitting diodes in a matrix and using a local dimming technology, it may be possible to achieve better brightness uniformity and a higher color contrast within a small light-mixing distance. As a result, a terminal product has an ultra-thin thickness, high color rendering property, high contrast and high brightness, which is superior to a traditional direct-lit or edge-lit back-light architecture. In addition, the plurality of micro light-emitting diodes may be disposed on a flexible substrate, and a passive display panel with a curved surface is combined, so that a curved display similar to that achieved by an organic light-emitting diode technology can be achieved under a condition that the image quality is ensured. As for display screen applications, the micro light-emitting diodes include micro light-emitting diodes for emitting light of three colors (such as red, green, and blue), which may have high brightness and contrast.

In some embodiments, as shown in FIGS. 2A to 2L, the plurality of first connection pads 2 each include at least one electrical connection layer 21. Each electrical connection layer 21 includes a main material layer 211 and at least one protective layer 212 disposed on a side of the main material layer 211 away from the base substrate. The at least one protective layer 212 includes a first reference protective layer 212A. The first reference protective layer 212A is a protective layer 212 farthest away from the base substrate 1 in the at least one protective layer 212. A material of the main material layer 211 includes copper. The at least one electrical connection layer 21 includes a first electrical connection layer 21A. The first electrical connection layer 21A is an electrical connection layer 21 farthest away from the base substrate 1 in the at least one electrical connection layer 21. In the at least one protective layer 212 included in the first electrical connection layer 21A, at least a material of the first reference protective layer 212A is capable of forming a first intermetallic compound with the first solder.

According to a description that the plurality of first connection pads 2 each include the at least one electrical connection layer 21 and each electrical connection layer 21 includes the main material layer 211 and the at least one protective layer 212 disposed on the side of the main material layer 211 away from the base substrate 1, it can be seen that, there is one or more electrical connection layers 21 in any one of the first connection pads 2, and each electrical connection layer 21 includes the main material layer 211 and one or more protective layers 212 disposed on the side of the main material layer 211 away from the base substrate 1.

Figure 2A:
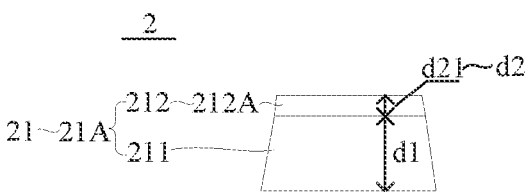
FIG. 2A is a sectional view illustrating a structure of a first connection pad, in accordance with some embodiments.
Figure 2B:
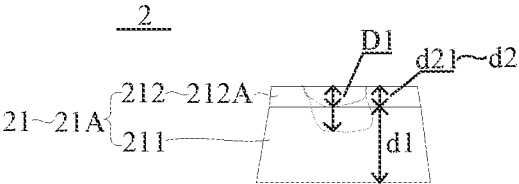
FIG. 2B is a sectional view illustrating a structure of another first connection pad, in accordance with some embodiments.
Figure 2C:
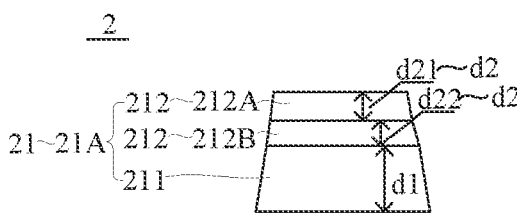
FIG. 2C is a sectional view illustrating a structure of yet another first connection pad, in accordance with some embodiments.
Figure 2D:
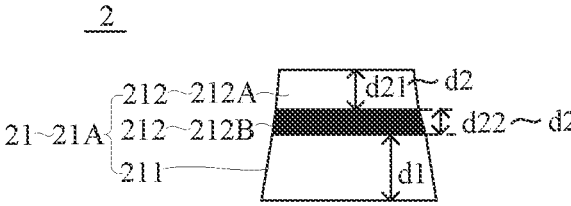
FIG. 2D is a sectional view illustrating a structure of yet another first connection pad, in accordance with some embodiments.

In a case where there is one electrical connection layer 21 in the first connection pad 2, the electrical connection layer 21 is the first electrical connection layer 21A. In this case, according to a description that the first electrical connection layer 21A may include one or more protective layers 212, there are two possible situations. In a first case, as shown in FIGS. 2A and 2B, the first electrical connection layer 21A includes one protective layer 212, and the protective layer 212 is the first reference protective layer 212A. In a second case, as shown in FIGS. 2C to 2G, the first electrical connection layer 21A includes a plurality of protective layers 212, and a protective layer 212 farthest away from the base substrate 1 in the plurality of protective layers 212 is the first reference protective layer 212A. In a case where there are a plurality of electrical connection layers 21 in the first connection pad 2, as shown in FIGS. 2H to 2L, the first electrical connection layer 21A is an electrical connection layer 21 farthest away from the base substrate 1 in the plurality of electrical connection layers 21. In this case, according to the description that the first electrical connection layer 21A includes one or more protective layers 212, there are two possible situations. In a first case, as shown in FIGS. 2H to 2L, the first electrical connection layer 21A includes one protective layer 212, and the protective layer 212 is the first reference protective layer 212A. In a second case, the first electrical connection layer 21A includes a plurality of protective layers 212, and a protective layer 212 farthest away from the base substrate 1 in the plurality of protective layers 212 is the first reference protective layer 212A.

Thus, in each first connection pad 2, the first reference protective layer 212A included in the first electrical connection layer 21A is a protective layer 212, which is exposed outside, in at least one protective layer 212 included in the at least one electrical connection layer 21; and in the at least one protective layer 212 included in the first electrical connection layer 21A, at least the material of the first reference protective layer 212A is capable of forming the first intermetallic compound with the first solder. Therefore, in a process of soldering the pin 30 of the electronic component 20 and the first connection pad 2 together by using the first solder, at least the first reference protective layer 212A included in the first electrical connection layer 21A forms the first intermetallic compound with the first solder, and the pin 30 forms a second intermetallic compound with the first solder, thereby achieving the soldering.

A compound formed by metal and metal or by metal and metalloid (such as H, B, N, S, P, C, Si) is referred to as the intermetallic compound. Elements in the intermetallic compound bond by metallic bonds to maintain metallic properties. The intermetallic compound is a product of an interfacial reaction. In the process of soldering the pin 30 of the electronic component 20 and the first connection pad 2 together by using the first solder, the first solder is melted under heating first; next, for the first connection pad 2, the material of the first reference protective layer 212A included in the first electrical connection layer 21A is melted, and a material of the pin 30 is melted simultaneously; then, metal atoms in the first solder diffuse and react with metal atoms in the first reference protective layer 212A and metal atoms in the pin 30, so that metal atoms in the first solder form the first intermetallic compound with the metal atoms in the first reference protective layer 212A, and metal atoms in the first solder form the second intermetallic compound with the metal atoms in the pin 30. In addition, as the first solder continues to diffuse, metal atoms in the first solder may also form a first intermetallic compound with metal atoms in the main material layer.

It can be understood that a formation speed of the intermetallic compound is related to the composition, melting point, temperature and reaction time of the material. In addition, with diffusion of two types of metal having different diffusion coefficients, an interface where film layers (in which the two types of metal are respectively located) are in contact will move. In general, the interface moves toward a film layer in which a type of metal with a larger diffusion coefficient is located. In some cases, the film layer in which the type of metal with the larger diffusion coefficient is located will further form voids in a nanometer size or micrometer size or gaps in a nanometer size or micrometer size therein.

It has been found through research that, in a case where the first connection pad 2 includes one electrical connection layer 21 (e.g., the first electrical connection layer 21A), the first electrical connection layer 21A includes only the first reference protective layer 212A, the material of the first reference protective layer 212A includes a copper-nickel alloy, a mass ratio of nickel in the copper-nickel alloy is less than 40%, and a thickness of the first reference protective layer 212A is 500 Å, in the process of soldering the pin 30 of the electronic component 20 and the first connection pad 2 together by using the first solder, as a part of the first solder diffuses into the first reference protective layer 212A and forms the first intermetallic compound with the first reference protective layer 212A, and after the part of the first solder forms the first intermetallic compound with the first reference protective layer 212A, another part of the first solder rapidly diffuses into the main material layer 211 included in the first electrical connection layer 21A and forms the first intermetallic compound with the main material layer 211 included in the first electrical connection layer 21A. As a result, a thickness of the first intermetallic compound at an interface of the solder joint is too large, which makes the solder joint brittle and the mechanical strength deteriorate. Thus, the solder joint is prone to embrittlement at the interface at the room temperature. For example, in a case where poor soldering (e.g., pseudo soldering or position offset of the electronic component 20) occurs, the maintenance is required. In a process of removing the electronic component, the main material layer 211 included in the first electrical connection layer 21A is easy to be removed. As a result, a copper deficiency may occur in the main material layer 211 included in the first electrical connection layer 21A, and the maintenance cannot be achieved.

In the embodiments of the present disclosure, the first connection pad 2 includes the at least one electrical connection layer 21, the at least one electrical connection layer 21 includes the first electrical connection layer 21A, and the first electrical connection layer 21A includes the at least one protective layer 212. Therefore, by reasonably setting the number of the protective layer(s) 212 included in the first electrical connection layer 21A and the material and/or the thickness of each layer in the first electrical connection layer 21A, it is possible to slow down a reaction speed of the first solder and the first reference protective layer 212A. That is, it may be possible to block diffusion of the first solder to the main material layer 211 included in the first electrical connection layer 21A, so as to avoid the copper deficiency in the main material layer 211 caused by an excessive thickness of the first intermetallic compound at the interface of the solder joint, thereby improving the maintainable rate.

In some embodiments, as shown in FIGS. 2A to 2L, a thickness d1 of the main material layer 211 included in the first electrical connection layer 21A is greater than or equal to 3000 Å and less than or equal to 50000 Å.

That is, in these embodiments, the thickness d1 of the main material layer 211 included in the first electrical connection layer 21A may take a value in a range of 3000 Å to 50000 Å, inclusive.

Optionally, the thickness d1 of the main material layer 211 included in the first electrical connection layer 21A is 6000 Å.

The material of the first reference protective layer 212A included in the first electrical connection layer 21A is not specifically limited, and the material of the first reference protective layer 212A included in the first electrical connection layer 21A may be any material capable of forming the first intermetallic compound with the first solder. For example, the material of the first reference protective layer 212A included in the first electrical connection layer 21A may include a metallic material and/or a non-metallic material.

In some embodiments of the present disclosure, the material of the first reference protective layer 212A included in the first electrical connection layer 21A is a metal simple substance or a metal alloy.

In some embodiments, the metal simple substance includes any one of Cu, Ni, Fe, Ag and Au. The metal alloy may be a metal alloy containing one or more simple substances of Cu, Ni, Fe, Ag and Au, such as a nickel alloy, a silver alloy, or a copper alloy.

In some examples, the metal alloy may be the nickel alloy. The nickel alloy is relatively cheap and readily available.

The nickel alloy may be any binary or ternary alloy containing nickel, such as a binary or ternary alloy consisting of Ni and Cu, Al, La, Pb, Co, Ag, Sb, In, Ga, Zn, Ta, Ru, Ti, Bi, Nd, Pd, Mg, Li, Sc, Y, Zr, Sr, Rb, Cs, Hf, Mn, Cr, Ge, TI, Ce, or Pr.

In some examples, the nickel alloy includes: a nickel-vanadium alloy, a nickel-aluminum alloy, a nickel-tungsten alloy, a copper-nickel-titanium alloy, or a copper-nickel-aluminum alloy. The copper alloy includes any one of a copper-nickel alloy or a copper-magnesium-aluminum alloy. In the nickel-vanadium alloy, a mass ratio of vanadium may be, for example, 7% or 40%. In the nickel-aluminum alloy, a mass ratio of aluminum may be, for example, 20%. In the nickel-tungsten alloy, a mass ratio of tungsten may be, for example, 49%.

Of course, in some embodiments, the material of the first reference protective layer 212A included in the first electrical connection layer 21A may be doped with other elements (e.g., other metallic elements or non-metallic elements not listed above).

For the nickel alloy, a mass ratio of nickel in the nickel alloy may take any value. For example, a mass ratio of nickel in the nickel-copper alloy may be in a range of 5% to 99%, inclusive. For example, a mass ratio of nickel in the nickel-aluminum alloy may also be in the range of 5% to 99%, inclusive.

A thickness d2 of one or more protective layers 212 included in the first electrical connection layer 21A is not specifically limited. In practical applications, the thickness d2 may be reasonably set according to needs to ensure that the first intermetallic compound formed by the first solder and at least the first reference protective layer 212A has a sufficient thickness during soldering, so as to improve soldering firmness.

In some embodiments, as shown in FIGS. 2A to 2L, the thickness d2 of each protective layer 212 included in the first electrical connection layer 21A is greater than or equal to 300 Å and less than or equal to 30000 Å.

In some embodiments, the thickness d2 or the material of the at least one protective layer 212 included in the first electrical connection layer 21A is further configured to block the diffusion of the first solder to the main material layer 211 included in the first electrical connection layer 21A.

In these embodiments, by selecting the thickness d2 or the material of the at least one protective layer 212 included in the first electrical connection layer 21A, it may be possible to adjust a reaction speed of the first solder and the at least one protective layer 212 included in the first electrical connection layer 21A. For example, the thickness d2 of the at least one protective layer 212 included in the first electrical connection layer 21A may be increased, so that a diffusion depth of the first solder in the first electrical connection layer 21A may be reduced in a same reaction time. Thus, it may be possible to block the diffusion of the first solder to the main material layer 211 included in the first electrical connection layer 21A, thereby improving the maintainable rate.

Figure 3:
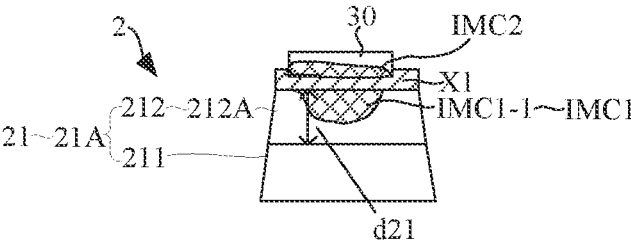
FIG. 3 is a structural diagram illustrating a connection between a first connection pad and a pin, in accordance with some embodiments.

In some embodiments, as shown in FIG. 3, in a case where the material of the first reference protective layer 212A included in the first electrical connection layer 21A includes copper or the copper-nickel alloy, and the mass ratio of nickel in the copper-nickel alloy is less than 40%, a thickness d21 of the first reference protective layer 212A included in the first electrical connection layer 21A is greater than or equal to 1000 Å. For example, the thickness d21 of the first reference protective layer 212A included in the first electrical connection layer 21A may be 3000 Å. In a case where the material of the first reference protective layer 212A included in the first electrical connection layer 21A includes the copper-nickel alloy, and the mass ratio of nickel in the copper-nickel alloy is greater than or equal to 40%, the thickness d21 of the first reference protective layer 212A included in the first electrical connection layer 21A is greater than or equal to 800 Å. For example, the thickness d21 of the first reference protective layer 212A included in the first electrical connection layer 21A may be 1000 Å. In a case where the material of the first reference protective layer 212A included in the first electrical connection layer 21A does not include copper, the thickness d21 of the first reference protective layer 212A included in the first electrical connection layer 21A is in a range of 300 Å to 30000 Å, inclusive. For example, the thickness d21 of the first reference protective layer 212A included in the first electrical connection layer 21A may be 500 Å.

In these embodiments, by limiting the material of the first reference protective layer 212A included in the first electrical connection layer 21A and limiting the thickness d21 of the first reference protective layer 212A included in the first electrical connection layer 21A in a corresponding range mentioned above, it may be possible to block the diffusion of the first solder X1 to the main material layer 211 included in the first electrical connection layer 21A, so that the main material layer 211 included in the first electrical connection layer 21A is not completely removed after the electronic component 20 is removed. As a result, the maintainable rate is improved.

In some examples, in a case where the material of the first reference protective layer 212A included in the first electrical connection layer 21A includes the copper-nickel alloy and the mass ratio of nickel in the copper-nickel alloy is less than 40%, and the thickness d21 of the first reference protective layer 212A included in the first electrical connection layer 21A is controlled to be 10000 Å, after the first solder is used for soldering once, the thickness of the first intermetallic compound formed by the first solder and the main material layer 211 included in the first electrical connection layer 21A is about 15000 Å; in a case where the thickness d21 of the first reference protective layer 212A included in the first electrical connection layer 21A is increased to be 40000 Å, the thickness of the first intermetallic compound formed by the first solder and the main material layer 211 included in the first electrical connection layer 21A is reduced to 10000 Å.

It can be seen that, in a case where the material of the first reference protective layer 212A included in the first electrical connection layer 21A is the same, by increasing the thickness of the first reference protective layer 212A included in the first electrical connection layer 21A, it may be possible to reduce the thickness of the first intermetallic compound IMC1 at the interface of the solder joint, thereby improving the maintainable rate.

In some embodiments, as shown in FIGS. 2A to 2L, in the case where the material of the first reference protective layer 212A included in the first electrical connection layer 21A includes copper or the copper-nickel alloy, the thickness d21 of the first reference protective layer 212A takes a value from a range of 300 Å to 600 Å, inclusive. In the case where the material of the first reference protective layer 212A included in the first electrical connection layer 21A does not include copper, the thickness d21 of the first reference protective layer 212A takes a value from a range of 300 Å to 3000 Å, inclusive.

In these embodiments, by limiting the material of the first reference protective layer 212A included in the first electrical connection layer 21A and limiting the thickness d21 of the first reference protective layer 212A included in the first electrical connection layer 21A in a corresponding range mentioned above, it may be possible to block the diffusion of the first solder X1 to the main material layer 211 included in the first electrical connection layer 21A, so that the main material layer 211 included in the first electrical connection layer 21A is not completely removed after the electronic component 20 is removed. As a result, the maintainable rate is improved.

In some embodiments, as shown in FIG. 2B, a diffusion depth D1 of the first solder in the at least one protective layer 212 is greater than or equal to the thickness d21 of the first reference protective layer 212A included in the first electrical connection layer 21A.

In these embodiments, by controlling the diffusion depth D1 of the first solder in the at least one protective layer 212 in the above range, it may be possible to ensure that the first intermetallic compound formed by the first solder and the first electrical connection layer 21A has a sufficient thickness while improving the maintainable rate, so as to improve the soldering firmness and conductivity.

In some embodiments, as shown in FIGS. 2C to 2G, the at least one protective layer 212 included in the first electrical connection layer 21A includes at least two protective layers 212. The at least two protective layers include the first reference protective layer 212A and a second reference protective layer 212B. The second reference protective layer 212B is located between the first reference protective layer 212A and the base substrate 1. A material of the second reference protective layer 212B is capable of forming another first intermetallic compound with the first solder, or the material of the second reference protective layer 212B is not capable of forming the another first intermetallic compound with the first solder.

In these embodiments, in the case where the material of the second reference protective layer 212B is capable of forming the first intermetallic compound with the first solder, the material of the second reference protective layer 212B may be the same as or different from the material of the first reference protective layer 212A. In the case where the material of the second reference protective layer 212B is not capable of forming the first intermetallic compound with the first solder, the material of the second reference protective layer 212B may be a simple substance selected from molybdenum, titanium and aluminum, or an alloy containing one or more simple substances of molybdenum, titanium and aluminum, such as a molybdenum alloy.

It will be noted that, in the case where the material of the second reference protective layer 212B included in the first electrical connection layer 21A is not capable of forming the first intermetallic compound with the first solder, in order to improve the maintainable rate, as for the selection of the material and thickness d21 of the first reference protective layer 212A included in the first electrical connection layer 21A, reference may be made to the above description, and details will not be repeated here.

In a case where the material of the second reference protective layer 212B is capable of forming the first intermetallic compound with the first solder, and the material and the thickness d21 of the first reference protective layer 212A are not sufficient to ensure the maintainable rate, the material and a thickness d22 of the second reference protective layer 212B may be set to ensure the maintainable rate. For example, in a case where the material of the first reference protective layer 212A includes the copper-nickel alloy and the mass ratio of nickel in the copper-nickel alloy is less than 40%, and the thickness d21 of the first reference protective layer 212A is less than or equal to 500 Å, by selecting the material and the thickness d22 of the second reference protective layer 212B, it may also be possible to adjust the thickness of the first intermetallic compound formed by the first solder and the second reference protective layer 212B, so as to reduce the thickness of the first intermetallic compound formed by the first solder and the main material layer 211 included in the first electrical connection layer 21A. As a result, the maintainable rate is improved.

In some embodiments, as shown in FIGS. 2C to 2G, the material of the second reference protective layer 212B is capable of forming the first intermetallic compound with the first solder. Materials of the at least two protective layers 212 are different. Alternatively, the thickness d2 of the at least one protective layer 212 is greater than 500 Å. Alternatively, a sum of thicknesses d2 of at least two protective layers is greater than 500 Å.

Compared with a case where there is one electrical connection layer 21 and the electrical connection layer 21 includes only one protective layer 212, a material of the protective layer 212 is a copper-nickel alloy, a mass ratio of nickel is less than 40%, and a thickness of the protective layer 212 is 500 Å, in these embodiments, by selecting materials of the at least two protective layers 212 (e.g., by selecting a material of at least one protective layer 212 (e.g., the first reference protective layer 212A or the second reference protective layer 212B) to be a material that is difficult to form the first intermetallic compound with the first solder (compared with the copper alloy)) to reduce the thickness of the first intermetallic compound, it may be possible to block the diffusion of the first solder to the main material layer 211 included in the first electrical connection layer 21A.

Alternatively, compared with the case where there is one electrical connection layer 21 and the electrical connection layer 21 includes only one protective layer 212, the material of the protective layer 212 is the copper-nickel alloy, the mass ratio of nickel is less than 40%, and the thickness of the protective layer 212 is 500 Å, by reasonably setting the materials and thicknesses d2 of the at least two protective layers 212 (e.g., by selecting the materials of the at least two protective layers 21 to be the same as the material of the one protective layer 212 and setting the sum of the thicknesses d2 of the at least two protective layers 212 to be relatively large (for example, a sum of the thickness d21 of the first reference protective layer 212A and the thickness d22 of the second reference protective layer 212B being 1000 Å), or by selecting the material of at least one protective layer 212 in the at least two protective layers 212 to be different from the material of the one protective layer 212 and setting the thickness d2 of the at least one protective layer 212 in the at least two protective layers 212 to be the same as or different from the thickness d2 of the one protective layer 212), it may also be possible to block the diffusion of the first solder to the main material layer 211 included in the first electrical connection layer 21A.

In some embodiments, the materials of the at least two protective layers 212 are different, which includes multiple possible cases.

In a first case, elements included in the at least two protective layers 212 are different.

In a second case, the at least two protective layers 212 include the same elements, but a ratio of the elements is different.

In a third case, the at least two protective layers 212 include the same base elements and a ratio of the base elements is the same, and at least one protective layer 212 in the at least two protective layers 212 further includes a dopant material doped in the base elements included in the at least one protective layer 212.

In the first case, the elements included in the at least two protective layers 212 are different, which means that each protective layer 212 may include one element or a plurality of elements. In a case where each protective layer 212 includes one element, the material of each protective layer 212 is a simple substance. In a case where each protective layer 212 includes the plurality of elements, the material of each protective layer 212 may be an alloy. In a case where a first part of the protective layers 212 (for example, the number of the protective layers 212 is three, and the first part of the protective layers 212 is the first reference protective layer 212A in the protective layers 212) includes one element, and a second part of the protective layers 212 (e.g., remaining two protective layers 212 in the three protective layers 212 other than the first reference protective layer 212A) includes the plurality of elements, the material of the first part of the protective layers 212 may be the simple substance, and the material of the second part of the protective layers 212 may be the alloy.

In the case where the material of each protective layer 212 is the simple substance, the materials of the at least two protective layers 212 are selected from different simple substances. Here, in an example where the material of each protective layer 212 is selected from a metal simple substance, and in the case where the number of the protective layers 212 is three, the materials of the three protective layers 212 may be selected from three different metal simple substances. For example, the materials of the three protective layers 212 may be a copper simple substance, a nickel simple substance and a silver simple substance, respectively. In the case where the material of each protective layer 212 is the alloy, the materials of the at least two protective layers 212 are selected from different alloys. Here, in an example where the material of each protective layer 212 is selected from the metal alloy, and in the case where the number of the protective layers 212 is three, in every two protective layers 212 in the three protective layers 212, at least one metallic element included in a protective layer 212 is different from metallic elements included in the other protective layer 212. For example, the materials of the three protective layers 212 may be a copper-nickel alloy, a copper-silver alloy and a nickel-silver alloy, respectively. In the at least two protective layers 212, the material of the first part of the protective layers 212 is selected from the simple substance, and the material of the second part of the protective layers 212 is selected from the alloy; and in this case, in every two protective layers 212 in the second part of the protective layers 212, at least one of metallic elements in the alloy included in a protective layer 212 is different from metallic elements in the alloy included in the other protective layer 212. For example, the materials of the three protective layers 212 may be a copper simple substance, a copper-nickel alloy and a nickel-silver alloy, respectively. In the at least two protective layers 212, the material of the first part of the protective layers 212 is selected from the alloy, and the material of the second part of the protective layers 212 is selected from the simple substance; and in this case, in every two protective layers 212 in the second part of the protective layers 212, a metal simple substance included in a protective layer 212 is different from a metal simple substance included in the other protective layer 212. For example, the materials of the three protective layers may be a copper simple substance, a nickel simple substance and a copper-nickel alloy, respectively.

In the second case, the at least two protective layers 212 include the same elements, but the ratio of the elements is different, which means that each protective layer 212 includes a plurality of elements, and types of the elements in the each protective layer 212 are the same, but a mass ratio of the elements is different. Still in the example where the material of each protective layer 212 is selected from the metal alloy, and in the case where the number of the protective layers 212 is three, the materials of the three protective layers may all be the copper-nickel alloy, but mass ratios of copper to nickel in at least two protective layers 212 in the three protective layers are different.

In the third case, the base element refers to an element having a greater content (e.g., a mass ratio) in all elements in the protective layer 212, and the dopant material refers to an element having a smaller content (e.g., a mass ratio) than the base element in the protective layer 212. In a case where the at least two protective layers 212 include the same base elements and the ratio of the base elements is the same, and the at least one protective layer 212 in the at least two protective layers 212 further includes the dopant material doped in the base elements included in the at least one protective layer 212, the at least two protective layers 212 include the same base elements and the mass ratio of the base elements is the same (that is, base materials of the at least two protective layers 212 are the same), and the base materials are respectively doped with dopant materials with different types or different ratios (e.g., different mass ratios), so that different materials (of the at least two protective layers 212) are obtained.

The at least two protective layers 212 include the same base elements and the ratio of the base elements is the same, and the at least one protective layer 212 in the at least two protective layers 212 further includes the dopant material doped in the base elements included in the at least one protective layer 212. That is, in a case where the number of the protective layers 212 is two, the two protective layers 212 include the same base elements and the mass ratio of the base elements is the same (the base elements may be copper and nickel with a mass ratio of 40:60, or the base element is a nickel simple substance); and a protective layer 212 in the two protective layers 212 further includes a dopant material (e.g., tungsten) doped in the base elements included in the protective layer 212, or the two protective layers each include a dopant material and types of the dopant materials respectively included in the two protective layers 212 are different (for example, the dopant materials respectively included in the two protective layers are tungsten and aluminum), or the two protective layers include the same dopant material but a doping ratio of the dopant material is different (for example, the dopant materials included in the two protective layers 212 are tungsten, and the mass ratios of tungsten in the protective layers 212 are 5% and 10%, respectively). In the case where the number of the protective layers 212 is three, the three protective layers all include the same base elements and the mass ratio of the base elements is the same (for example, the three protective layers 212 include base elements of copper and nickel with a mass ratio of 40:60, or the base element is the nickel simple substance); and at least two protective layers 212 in the three protective layers 212 each include a dopant material and types of the dopant materials respectively included in every two of the at least two protective layers 212 are different (for example, the dopant materials respectively included in the three protective layers are any three in tungsten, aluminum, neodymium and vanadium), or any two or every two protective layers 212 in the three protective layers include the same dopant material but a mass ratio of the dopant material is different (for example, the dopant materials included in the three protective layers 212 each are tungsten, and mass ratios of tungsten in the protective layers 212 are 5%, 10% and 20%, respectively).

Here, those skilled in the art can understand that, in the case where the base material of each protective layer 212 is the metal simple substance, the material of each of the at least two protective layers 212 may be regarded as a mixed material of the base element and dopant material included in the protective layer. The only difference between the third case and the second case lies in that, in the second case, contents of elements included in the at least two protective layers 212 are comparable (that is, a difference between the contents is small (for example, a difference between mass ratios of elements in the same protective layer 212 may be not more than 10%)); but in the third case, the content of the dopant material is less than the content of the base element. For example, in a case where the protective layer 212 includes two metal simple substances, an element of one metal simple substance in the two metal simple substances is the base element, and an element of the other metal simple substance in the two metal simple substances is an element included in the dopant material, the mass ratio of the dopant material in the protective layer 212 may be less than 40%, such as 10%, 15% or 20%.

In some embodiments, as shown in FIGS. 1 and 2C to 2G, in a direction pointing from the first connection pad 2 to the base substrate 1, a diffusion depth of the first solder in the at least two protective layers 212 per unit time gradually decreases; and/or melting points of the materials of the at least two protective layers 212 gradually increase.

In these embodiments, in the direction pointing from the first connection pad 2 to the base substrate 1, the diffusion depth of the first solder in the at least two protective layers 212 per unit time gradually decreases, which means that in the direction pointing from the first connection pad 2 to the base substrate 1, a reaction speed of the first solder and the materials of the at least two protective layers 212 gradually decreases. That is, the closer to the base substrate 1, the smaller the speed of forming the first intermetallic compound by the material of the protective layer 212 and the first solder, and the more difficult the material of the protective layer 212 is to form the first intermetallic compound with the first solder. In this case, there are two possible situations. In a first case, the closer to the base substrate 1, the smaller the mass ratio of the elements capable of forming the first intermetallic compound with the first solder in the material of the protective layer 212, and/or the smaller a reaction capability of the element capable of forming the first intermetallic compound with the first solder in the material of the protective layer 212. In a second case, the closer to the base substrate 1, the severer the condition of forming the first intermetallic compound by the material of the protective layer 212 and the first solder (for example, a reaction temperature is higher and higher).

In the first situation, in a case where the reaction condition is just sufficient to enable the at least two protective layers 212 and the first solder to form the first intermetallic compound, due to materials, the closer to the base substrate 1, the smaller the speed of forming the first intermetallic compound by the material of the protective layer 212 and the first solder. In this way, as the first solder continuously diffuses into the protective layers 212 and forms the first intermetallic compound with the protective layers 212, the diffusion speed of the first solder continuously decreases, thereby blocking the diffusion of the first solder to the main material layer 211 included in the first electrical connection layer 21A. In the second situation, as the first solder gets closer to the base substrate 1, the reaction condition is continuously changed. For example, as the first solder gets closer to the base substrate 1, a first protective layer 212 in the at least two protective layers 212 forms a first intermetallic compound with the first solder at a first temperature, a second protective layer 212 in the at least two protective layers 212 forms a first intermetallic compound with the first solder at a second temperature, and a third protective layer 212 in the at least two protective layers 212 forms a first intermetallic compound with the first solder at a third temperature. The first temperature is less than the second temperature, and the second temperature is less than the third temperature. After the three protective layers 212 are fabricated, during soldering, a protective layer 212 farthest away from the base substrate 1 (i.e., the first protective layer 212) firstly forms the first intermetallic compound with the first solder at the first temperature. In this case, the first solder will not form the first intermetallic compound with other protective layers 212 (e.g., the second protective layer 212 and the third protective layer 212), or the diffusion speed of the first solder to the other protective layers 212 is small, so that the thickness of the first intermetallic compound formed by the first solder and the at least two protective layers 212 can be controlled. In a case where the maintenance is required, by removing only the first intermetallic compound formed by the protective layer 212 farthest away from the base substrate 1 (i.e., the first reference protective layer 212A) and the first solder, and then by making the first solder form the first intermetallic compound with the second protective layer 212 in a severe condition (e.g., at the second temperature), it is possible to achieve the maintenance.

In some examples, the first temperature may be greater than or equal to 250° C. and less than or equal to 300° C., the second temperature may be greater than 300° C. and less than or equal to 350° C., and the third temperature may be greater than 350° C. and less than or equal to 400° C.

According to a formation mechanism of the first intermetallic compound, at a certain temperature, the first solder and at least one element in the protective layer 212 are bonded to obtain the first intermetallic compound. As the heating time extends, the thickness of the first intermetallic compound formed by the first solder and the at least one element in the protective layer 212 increases. The heating temperature is related to the melting point of the first solder and the melting point of the material of the protective layer 212. In a case where the first solder is determined, as the melting points of the materials of at least two protective layers 212 increase, the heating temperature increases, and the reaction temperature increases. In this case, similar to the second situation, it can control the thickness of the first intermetallic compound formed by the first solder and the at least two protective layers 212. In the case where the maintenance is required, by removing only the first intermetallic compound formed by the protective layer 212 farthest away from the base substrate 1 (i.e., the first reference protective layer 212A) and the first solder, and then by making the first solder form the first intermetallic compound with the second protective layer 212 in the severe condition (e.g., at a relatively high temperature), it is possible to achieve the maintenance. That is, as described above, in the direction pointing from the first connection pad 2 to the base substrate 1, the melting points of the materials of the at least two protective layers 212 gradually increase.

In some embodiments, the dopant material may be metal aluminum.

That is, in these embodiments, by selecting the base element as nickel, and selecting the dopant material as any one element of Al, La, Pb, Co, Ag, Sb, In, Ga, Zn, Ta, Ru, Ti, Bi, Nd (e.g., Al), and by gradually increasing the mass ratio of the dopant element in the at least two protective layers 212 in the direction pointing from the first connection pad 2 to the base substrate 1, it may be possible to achieve a purpose that the diffusion depth of the first solder in the at least two protective layers 212 per unit time gradually decreases.

Of course, the above descriptions are just exemplary. It can be understood that the base element may also be an element included in metal simple substances other than copper and nickel. In this case, since metal nickel is most likely to form the first intermetallic compound with the first solder other than copper, by selecting the base element as the element included in the metal simple substances other than copper and nickel (e.g., Al, La, Pb, Co, Ag, Sb, In, Ga, Zn, Ta, Ru, Ti, Bi, or Nd), and selecting metal nickel as the dopant material, and by gradually decreasing a mass ratio of metal nickel in the at least two protective layers 212 in the direction pointing from the first connection pad 2 to the base substrate 1, it is also possible to achieve the purpose that the diffusion depth of the first solder in the at least two protective layers 212 per unit time gradually decreases.

In some other embodiments, the dopant material may be metal tungsten.

In a case where the at least two protective layers 212 include the same base elements and the ratio of the base elements is the same, the at least one protective layer 212 further includes the dopant material doped in the base elements included in the at least one protective layer 212; the melting points of the materials of the at least two protective layers 212 gradually increase in the direction pointing from the first connection pad 2 to the base substrate 1; and the base element may be an element included in metal simple substances other than tungsten. For example, the base element may be nickel. In this case, by gradually increasing a mass ratio of metal tungsten in the at least two protective layers 212 in the direction pointing from the first connection pad 2 to the base substrate 1, it may be possible to achieve the purpose that the melting points of the materials of the at least two protective layers 212 gradually increase.

In some embodiments, as shown in FIGS. 2C to 2G, in the direction pointing from the first connection pad 2 to the base substrate 1, a ratio of the element capable of forming the first intermetallic compound with the first solder in the at least two protective layers 212 gradually decreases.

In an example where the base element included in the at least two protective layers 212 is nickel and the dopant element included in the at least two protective layers 212 is tungsten, in the direction pointing from the first connection pad 2 to the base substrate 1, a mass ratio of tungsten gradually increases, and accordingly, a mass ratio of nickel gradually decreases.

Thicknesses d2 of the at least two protective layers 212 are not specifically limited. For example, the thicknesses d2 of the at least two protective layers 212 may be the same or different.

In a case where the thicknesses d2 of the at least two protective layers 212 are the same, the thicknesses d2 of the at least two protective layers 212 may both be 6000 Å. In a case where the thicknesses d2 of the at least two protective layers 212 are different, the thickness d21 of the first reference protective layer 212A is, for example, 500 Å, and the thickness d22 of the second reference protective layer 212B may be less than 500 Å or greater than 500 Å.

Figure 2E:
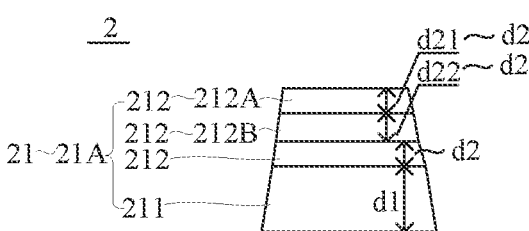
FIG. 2E is a sectional view illustrating a structure of yet another first connection pad, in accordance with some embodiments.
Figure 2F:
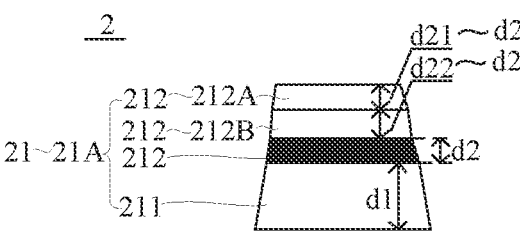
FIG. 2F is a sectional view illustrating a structure of yet another first connection pad, in accordance with some embodiments.

In some embodiments, as shown in FIGS. 2E and 2F, in the direction pointing from the first connection pad 2 to the base substrate 1, the thicknesses d2 of the at least two protective layers 212 gradually increase. In this way, as the first solder continuously diffuses downward, the diffusion of the first solder to the main material layer 211 included in the first electrical connection layer 21A may be controlled more and more easily, so that it is more advantageous to block the diffusion of the first solder to the main material layer 211 included in the first electrical connection layer 21A.

In some examples, as shown in FIGS. 2E and 2F, the thickness d22 of the second reference protective layer 212B is greater than or equal to 1000 Å and less than or equal to 30000 Å, and the thickness d21 of the first reference protective layer 212A is greater than or equal to 300 Å and less than or equal to 1000 Å.

In these embodiments, by limiting the thickness d21 of the first reference protective layer 212A and the thickness d22 of the second reference protective layer 212B in the respective ranges, it may be possible to provide a possibility to the second reference protective layer 212B for subsequent multiple times of maintenance while ensuring the subsequent maintainable rate, thereby further improving the maintainable rate.

The number of the protective layers 212 is not specifically limited. The more the number of the protective layers 212, the more times the subsequent maintenance can be performed in a case where the material and the thickness d2 of each protective layer 212 can meet one time of maintenance.

For example, the number of the protective layers 212 may be two, three, four or even five, six or more.

Considering an impact of production capacity, optionally, as shown in FIGS. 2C to 2G, the number of the protective layers 212 is two or three.

It will also be noted that, in a case where the number of the protective layers 212 is multiple, the materials and the thicknesses d2 of at least two protective layers 212 are further configured to adjust the diffusion depth of the first solder in the first electrical connection layer 21A, so as to ensure that the diffusion depth of the first solder in the first electrical connection layer 21A is relatively large. As a result, the soldering firmness is improved.

Figure 2G:
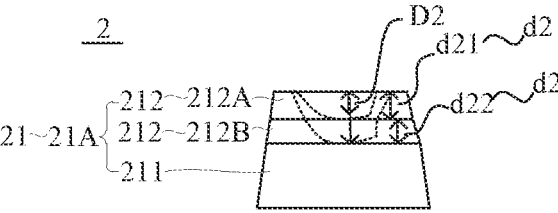
FIG. 2G is a sectional view illustrating a structure of yet another first connection pad, in accordance with some embodiments.

In some embodiments, as shown in FIG. 2G, the diffusion depth D2 of the first solder in the first electrical connection layer 21A is greater than or equal to the thickness d21 of the first reference protective layer 212A included in the first electrical connection layer 21A, and less than or equal to the sum of the thickness d21 of the first reference protective layer 212A included in the first electrical connection layer 21A and the thickness d22 of the second reference protective layer 212B included in the first electrical connection layer 21A.

In these embodiments, by controlling the diffusion depth D2 of the first solder in the first electrical connection layer 21A in the above range, it is possible to provide a possibility for the subsequent maintenance while ensuring the soldering firmness.

Figure 2H:
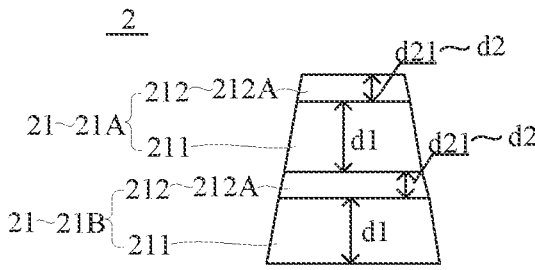
FIG. 2H is a sectional view illustrating a structure of yet another first connection pad, in accordance with some embodiments.
Figure 2I:
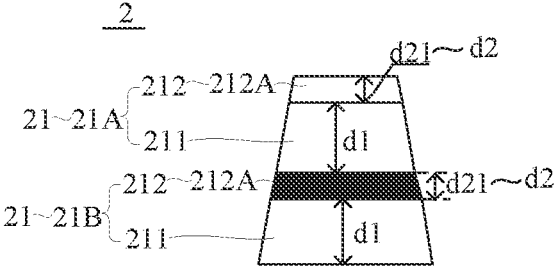
FIG. 2I is a sectional view illustrating a structure of yet another first connection pad, in accordance with some embodiments.
Figure 2J:
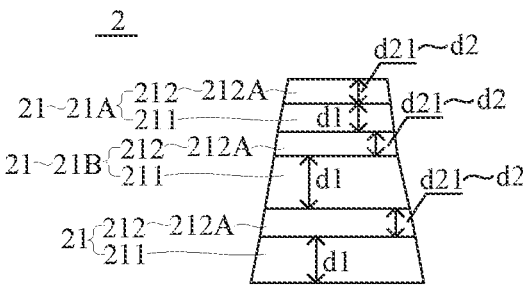
FIG. 2J is a sectional view illustrating a structure of yet another first connection pad, in accordance with some embodiments.
Figure 2K:
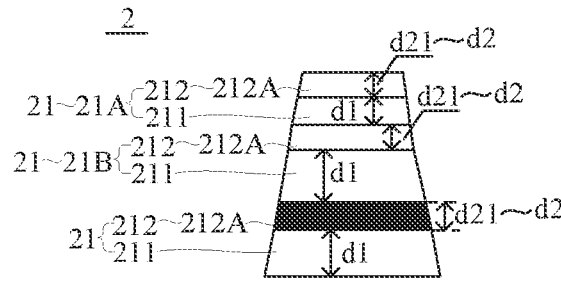
FIG. 2K is a sectional view illustrating a structure of yet another first connection pad, in accordance with some embodiments.

In some embodiments, as shown in FIGS. 2H to 2L, the at least one electrical connection layer 21 further includes a second electrical connection layer 21B, and the second electrical connection layer 21B is located between the first electrical connection layer 21A and the base substrate 1. As shown in FIGS. 2H, 2J, 2K and 2L, a material of the first reference protective layer 212A included in the second electrical connection layer 21B is capable of forming another first intermetallic compound with the first solder; or as shown in FIG. 2I, the material of the first reference protective layer 212A included in the second electrical connection layer 21B is not capable of forming the another first intermetallic compound with the first solder.

In the case where the material of the first reference protective layer 212A included in the second electrical connection layer 21B is capable of forming the first intermetallic compound with the first solder, the material of the first reference protective layer 212A included in the second electrical connection layer 21B may be the same as or different from the material of the first reference protective layer 212A included in the first electrical connection layer 21A. In the case where the material of the first reference protective layer 212A included in the second electrical connection layer 21B is not capable of forming the first intermetallic compound with the first solder, the material of the first reference protective layer 212A included in the second electrical connection layer 21B may be a simple substance selected from molybdenum, titanium, and aluminum; or may be an alloy containing one or more simple substances of molybdenum, titanium, and aluminum (e.g., a molybdenum alloy).

It will be noted that, in the case where the material of the first reference protective layer 212A included in the second electrical connection layer 21B is not capable of forming the first intermetallic compound with the first solder, in order to improve the maintainable rate, as for materials of the main material layer 211 and the at least one protective layer 212 that are included in the second electrical connection layer 21B and thicknesses of the main material layer 211 and the at least one protective layer 212 that are included in the second electrical connection layer 21B, reference may be made to the above description of materials of the main material layer 211 and the at least one protective layer 212 that are included in the first electrical connection layer 21A (the first electrical connection layer 21A is included in the at least one electrical connection layer 21) and thicknesses of the main material layer 211 and the at least one protective layer 212 that are included in the first electrical connection layer 21A, and details will not be repeated here. In a case where the material of the first reference protective layer 212A included in the second electrical connection layer 21B is capable of forming the first intermetallic compound with the first solder, and the at least one protective layer 212 included in the first electrical connection layer 21A is insufficient to ensure the maintainable rate, the material and the thickness d2 of the at least one protective layer 212 included in the second electrical connection layer 21B may also be selected to ensure the maintainable rate. For example, in a case where the material and the thickness of the first electrical connection layer 21A are the same as the material and the thickness of the one electrical connection layer 21, and the main material layer 211 included in the first electrical connection layer 21A is completely removed during the subsequent maintenance, the maintenance may be continued due to the existence of the second electrical connection layer 21B, thereby improving the maintenance rate.

In some embodiments, the material of the first reference protective layer 212A included in the second electrical connection layer 21B is capable of forming the first intermetallic compound with the first solder, and the material of the first reference protective layer 212A included in the second electrical connection layer 21B is different from the material of the first reference protective layer 212A included in the first electrical connection layer 21A. Alternatively, as shown in FIG. 2I, at least one of the thickness d21 of the first reference protective layer 212A included in the second electrical connection layer 21B and the thickness d21 of the first reference protective layer 212A included in the first electrical connection layer 21A is greater than 500 Å. Alternatively, as shown in FIGS. 2H, 2J, 2K and 2L, a sum of the thickness d21 of the first reference protective layer 212A included in the second electrical connection layer 21B and the thickness d21 of the first reference protective layer 212A included in the first electrical connection layer 21A is greater than 500 Å.

In these embodiments, compared with the case where there is one electrical connection layer 21, and the electrical connection layer 21 includes only one protective layer 212, the material of the protective layer 212 is the copper-nickel alloy, the mass ratio of nickel is less than 40%, and the thickness of the protective layer 212 is 500 Å, by selecting the materials of the first electrical connection layer 21A and the second electrical connection layer 21B (e.g., by selecting the material of the protective layer 212 included in at least one electrical connection layer 21 as a material that is difficult to form the first intermetallic compound with the first solder), the thickness of the first intermetallic compound is reduced, which may provide a possibility for the subsequent maintenance.

Alternatively, compared with the case where there is one electrical connection layer 21, and the electrical connection layer 21 includes only one protective layer 212, the material of the protective layer 212 is the copper-nickel alloy, the mass ratio of nickel is less than 40%, and the thickness of the protective layer 212 is 500 Å, by reasonably setting the materials and the thicknesses d2 of the at least two electrical connection layers 21 (e.g., by controlling the thickness d2 of the protective layer 212 included in at least one of the first electrical connection layer 21A and the second electrical connection layer 21B to be greater than 500 Å, or by controlling the sum of the thicknesses d2 of the protective layers 212 included in the first electrical connection layer 21A and the second electrical connection layer 21B to be greater than 500 Å), it is also possible to provide a possibility for the subsequent maintenance.

In some embodiments, the material of the first reference protective layer 212A included in the second electrical connection layer 21B is different from the material of the first reference protective layer 212A included in the first electrical connection layer 21A, which has many possible situations; and reference may be made to the above descriptions that the electrical connection layer 21 includes the first electrical connection layer 21A, and the materials of the at least two protective layers 212 included in the first electrical connection layer 21A are different, and details will not be repeated here.

The difference from the electrical connection layer 21 including the first electrical connection layer 21A and the first electrical connection layer 21A including only the plurality of protective layers 212 is that, each electrical connection layer 21 in the at least two electrical connection layers 21 here further includes the main material layer 211 in addition to the protective layer(s) 212, and the thickness d1 of the main material layer 211 also has a technical effect in providing a possibility for one or more times of subsequent maintenance. Without considering the maintenance effect of the main material layer 211, as for materials and thicknesses of the first reference protective layer 212A included in the second electrical connection layer 21B and the first reference protective layer 212A included in the first electrical connection layer 21A, reference may be made to the above descriptions of the materials and thicknesses of the first reference protective layer 212A and the second reference protective layer 212B that are included in the first electrical connection layer 21A. Considering the maintenance effect of the main material layer 211, in practical applications, in order to achieve the same technical effect, in a case where the material of the first reference protective layer 212A included in the first electrical connection layer 21A and the material of the first reference protective layer 212A included in the second electrical connection layer 21B are the same as materials of the first reference protective layer 212A and the second reference protective layer 212B that are included in the first electrical connection layer 21A (the first electrical connection layer 21A is included in the at least one electrical connection layer 21), respectively, the sum of the thickness d21 of the first reference protective layer 212A included in the second electrical connection layer 21B and the thickness d21 of the first reference protective layer 212A included in the first electrical connection layer 21A may be less than the sum of the thickness d21 of the first reference protective layer 212A and the thickness d22 of the second reference protective layer 212B that are included in the first electrical connection layer 21A in the at least one electrical connection layer 21.

In some embodiments, the thickness d1 of the main material layer 211 included in the second electrical connection layer 21B is greater than or equal to 3000 Å and less than or equal to 50000 Å. That is, in these embodiments, the thickness d1 of the main material layer 211 included in the first electrical connection layer 21A may take a value in a range of 3000 Å to 50000 Å, inclusive.

Optionally, the thickness d1 of the main material layer 211 included in the first electrical connection layer 21A is 6000 Å.

In some embodiments, the thickness d1 of the main material layer 211 included in the second electrical connection layer 21B may be the same as or different from the thickness d1 of the main material layer 211 included in the first electrical connection layer 21A.

The above descriptions only show a case where the at least one electrical connection layer 21 includes the first electrical connection layer 21A and the second electrical connection layer 21B, and it can be understood that, the at least one electrical connection layer 21 may further include a third electrical connection layer and a fourth electrical connection layer. In the case where the at least one electrical connection layer 21 further includes the third electrical connection layer and the fourth electrical connection layer, the third electrical connection layer and the fourth electrical connection layer may be disposed between the second electrical connection layer 21B and the base substrate 1. As for the arrangement of the third electrical connection layer and the fourth electrical connection layer, reference may be made to the second electrical connection layer 21B. As for materials and thicknesses of the first electrical connection layer 21A, the second electrical connection layer 21B, the third electrical connection layer and the fourth electrical connection layer, reference may be made to the descriptions of materials and thicknesses of the plurality of protective layers 212 (for example, the number of the plurality of protective layers 212 is greater than or equal to 4) included in the first electrical connection layer 21A in the at least one electrical connection layer 21.

As shown in FIGS. 2H to 2L, in the case where the at least one electrical connection layer 21 further includes the second electrical connection layer 21B, thicknesses of first reference protective layers 212A included in the at least two electrical connection layers 21 are not specifically limited, and the thicknesses d21 of the first reference protective layers 212A included in the at least two electrical connection layers 21 may be the same or different.

In the case where the thicknesses d21 of the first reference protective layers 212A included in the at least two electrical connection layers 21 are the same, the thicknesses d21 of the first reference protective layers 212A included in the at least two electrical connection layers 21 may each be 6000 Å. In the case where the thicknesses d21 of the first reference protective layers 212A included in the at least two electrical connection layers 21 are different, in every two adjacent electrical connection layers 21, the thickness d21 of the first reference protective layer 212A included in a lower electrical connection layer may be greater than or less than the thickness d21 of the first reference protective layer 212A included in an upper electrical connection layer. For example, in the first electrical connection layer 21A and the second electrical connection layer 21B, the thickness d21 of the first reference protective layer 212A included in the first electrical connection layer 21A is 500 Å, and the thickness d21 of the first reference protective layer 212A included in the second electrical connection layer 21B may be less than 500 Å or greater than 500 Å.

In some embodiments, as shown in FIG. 2H, the thickness d21 of the first reference protective layer 212A included in the second electrical connection layer 21B is greater than the thickness d21 of the first reference protective layer 212A included in the first electrical connection layer 21A.

In these embodiments, as a downward diffusion path of the first solder becomes longer, it is easier to control the diffusion of the first solder to the main material layer 211 included in the first electrical connection layer 21A. Thus, it is more advantageous to block the diffusion of the first solder to the main material layer 211 included in the first electrical connection layer 21A.

In some examples, as shown in FIG. 2H, the thickness d21 of the first reference protective layer 212A included in the second electrical connection layer 21B is greater than or equal to 1000 Å and less than or equal to 30000 Å, and the thickness d21 of the first reference protective layer 212A included in the first electrical connection layer 21A is greater than or equal to 300 Å and less than or equal to 1000 Å.

In these embodiments, by limiting the thickness d21 of the first reference protective layer 212A included in the second electrical connection layer 21B and the thickness d21 of the first reference protective layer 212A included in the first electrical connection layer 21A in the respective ranges, it may be possible to provide a possibility to the first reference protective layer 212A included in the second electrical connection layer 21B for multiple times of subsequent maintenance while ensuring the subsequent maintainable rate, thereby further improving the maintainable rate.

Optionally, the thickness d21 of the first reference protective layer 212A included in the first electrical connection layer 21A is 500 Å, and the thickness d21 of the first reference protective layer 212A included in the second electrical connection layer 21B is 6000 Å.

The number of the electrical connection layers 21 is not specifically limited, which may be two, three, four or even five, six or more. The more the number of the electrical connection layers 21, the more times the subsequent maintenance can be performed in the case where the material and the thickness D of each electrical connection layer 21 can meet one time of maintenance.

Considering the impact of production capacity, optionally, the number of the electrical connection layers 21 is less than or equal to five.

Figure 2L:
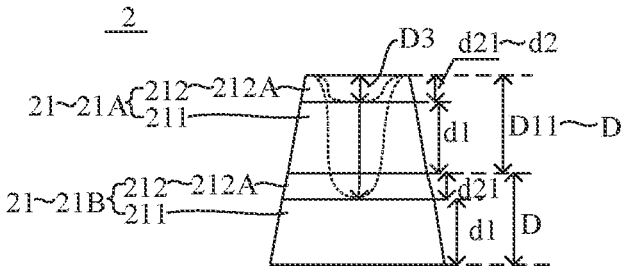
FIG. 2L is a sectional view illustrating a structure of yet another first connection pad, in accordance with some embodiments.

It will also be noted that, in a case where there are a plurality of electrical connection layers 21, as shown in FIG. 2L, materials and thicknesses of at least two electrical connection layers 21 are further configured to adjust a diffusion depth D3 of the first solder in the plurality of electrical connection layers 21, so as to ensure that the diffusion depth D3 of the first solder in the plurality of electrical connection layers 21 is large, thereby improving the soldering firmness.

For example, the at least one electrical connection layer 21 includes at least the first electrical connection layer 21A and the second electrical connection layer 21B, the first electrical connection layer 21A and the second electrical connection layer 21B each include the main material layer 211 and the first reference protective layer 212A, materials of first reference protective layers 212A included in the first electrical connection layer 21A and the second electrical connection layer 21B each are capable of forming the first intermetallic compound with the first solder, and materials of main material layers 211 included in the first electrical connection layer 21A and the second electrical connection layer 21B each are capable of forming the first intermetallic compound with the first solder; as shown in FIG. 2L, a total diffusion depth D3 of the first solder in the first electrical connection layer 21A and the second electrical connection layer 21B is greater than or equal to the thickness d21 of the first reference protective layer 212A included in the first electrical connection layer 21A, and less than or equal to a sum of the thickness D11 of the first electrical connection layer 21A and the thickness d21 of the first reference protective layer 212A included in the second electrical connection layer 21B.

In some embodiments, as shown in FIG. 1, the base substrate 1 further has a bonding area B. The wiring board 10 further includes a plurality of second connection pads 3 disposed on the base substrate 1 and located in the bonding area B. The plurality of second connection pads 3 are configured to be electrically connected to the circuit board and/or the IC.

In some embodiments, the second connection pads 3 and the first connection pads 2 are located in a same film layer, and the second connection pads 3 and the first connection pads 2 may be formed through a single patterning process. The single patterning process refers to forming required patterns through a film formation process and photolithography process. The single patterning process includes film formation, exposure, development, etching and stripping processes. The second connection pads 3 and the first connection pads 2 are located in the same film layer, so that the number of patterning processes may be reduced, a manufacturing process may be simplified, and a production cost may be greatly reduced. Here, considering an example in which the first connection pad 2 includes one electrical connection layer 21, and the electrical connection layer 21 includes the main material layer 211 and one protective layer 212, the second connection pad 3 and the first connection pad 2 being located in the same film layer means that, the second connection pad 3 also includes one electrical connection layer 31 and the electrical connection layer 31 includes a main material layer 311 and one protective layer 312, the main material layer 311 and the main material layer 211 are located in a same film layer, and the protective layer 312 and the protective layer 212 are located in a same film layer. In addition, a structure of the second connection pad 3 is the same as a structure of the first connection pad 2, and thus, in a case where the structure of the first connection pad 2 may be maintained, it may also achieve maintenance for the circuit board and/or the IC when a bonding error occurs in the bonding area B of the functional backplane 1.

In some embodiments, as shown in FIG. 1, the wiring board 10 further includes a first wiring layer 4 located between the first connection pads 2 and the base substrate 1. The first wiring layer 4 includes a first metal sub-layer 41, a first wiring sub-layer 42 and a second metal sub-layer 43 that are stacked. The first connection pad 2 and the second connection pad 3 are electrically connected to different conductive patterns or different conductive circuits in the second metal sub-layer 43.

Materials of the first metal sub-layer 41 and the second metal sub-layer 43 each include a molybdenum-niobium alloy. The molybdenum-niobium alloy has adhesion to enhance an adhesive force between the first wiring layer 4 and the base substrate 1. In some cases, in order to prevent the base substrate 1 from breaking due to an excessive stress caused by an excessive overall area of the first wiring layer 4, a buffer layer may be provided between the base substrate 1 and the first wiring layer 4 to relieve the stress. In addition, the first metal sub-layer 41 whose material includes the molybdenum-niobium alloy may further enhance the adhesive force between the first wiring layer 4 and the buffer layer. A material of the buffer layer is, for example, silicon nitride. In addition, the second metal sub-layer 43 whose material including the molybdenum-niobium alloy is connected to the first connection pad 2. Due to the adhesion of the molybdenum-niobium alloy, it may ensure a stable connection between the first wiring layer 4 and the first connection pad 2. Moreover, the molybdenum-niobium alloy has conductivity, which may ensure the conductivity between the first connection pad 2 and the first wiring layer 4. A material of the first wiring sub-layer 42 may include copper. The copper has good conductivity, which may ensure the electrical connection between film layers; the copper has a small resistance, which may reduce a loss of current during operation; and the copper has a low price, which may reduce the manufacturing cost of the functional backplane 100. In addition, the second metal sub-layer 43 whose material including the molybdenum-niobium alloy may protect the copper in the first wiring sub-layer 42 and prevent the copper from being oxidized.

In some embodiments, as shown in FIG. 1, a thickness of the first wiring sub-layer 42 may be in a range of 1 μm to 3 μm, inclusive.

In some embodiments, FIG. 1 shows an example in which the second connection pads 3 are disposed in a same film layer as the first connection pads 2; of course, the second connection pads 3 may also be disposed in a same film layer as the first wiring layer 4, or the second connection pads 3 are disposed in same film layers as the first wiring layer 4 and the first connection pads 2 simultaneously.

In some embodiments, as shown in FIG. 1, the wiring board 10 further includes: a first passivation layer 51 located between the first wiring layer 4 and the first connection pads 2, a first planarization layer 61 located between the first passivation layer 51 and the first connection pads 2, and a second planarization layer 62 located on a side of the first connection pads 2 away from the base substrate 1 and covering regions between the first connection pads 2, all of which are disposed in the device area A.

Figure 4:
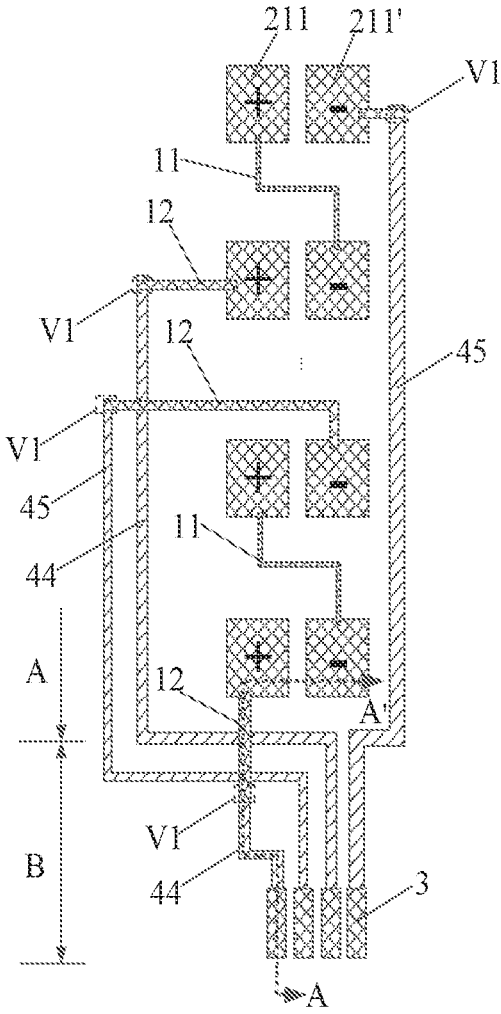
FIG. 4 is a top view illustrating a first wiring layer and first connection pads, in accordance with some embodiments.

As show in FIGS. 4 and 5, FIG. 5 is a sectional view taken along the line AA' in FIG. 4. The first wiring layer 4 may include anode traces 44 and cathode traces 45. That is, the anode traces 44 and the cathode traces 45 each adopt an arrangement of a stacked structure. In order to reduce a voltage drop (IR Drop), the thickness of the first wiring sub-layer 42 is greater than the thickness of the main material layer 211 in the first connection pad 2, and the thickness of the first wiring sub-layer 42 is positively related to a size of the functional backplane. The first metal sub-layer 41, the first wiring sub-layer 42 and the second metal sub-layer 43 may each be fabricated in sequence through a sputtering process. The second metal sub-layer 43 may protect the first wiring sub-layer 42 and prevent a surface of the first wiring sub-layer 42 from being oxidized.

In some embodiments, as shown in FIGS. 4 and 5, the first passivation layer 51 includes a portion located between the anode trace 44 and the cathode trace 45, so as to separate adjacent traces and avoid incorrect electrical connection between the adjacent traces. A material of the first passivation layer 51 may be silicon nitride, silicon oxide, silicon oxynitride, or the like. The first planarization layer 61 covers a region between the anode trace 44 and the cathode trace 45. The first planarization layer 61 may be an organic film, which is used for filling a gap region between traces to avoid a large step difference in subsequent processes, and to ensure that an offset of the electronic component is not occurred when the electronic component is connected to the wiring board. As a result, the flatness of the functional backplane is improved. In addition, the first planarization layer 61 may further play a role of insulation.

In some embodiments, as shown in FIG. 5, a thickness of the first passivation layer 51 may be in a range of 1000 Å to 4000 Å, inclusive.

In some embodiments, as shown in FIG. 1, the wiring board 10 may further include an adhesive layer 7. The adhesive layer 7 is disposed between the at least one electrical connection layer 21 and the first planarization layer 61. A material of the adhesive layer 7 may include a molybdenum-niobium alloy. The molybdenum-niobium alloy has adhesion, which may enhance an adhesive force between the first connection pad 2 and the first planarization layer 61.

In some other embodiments, the material of the adhesive layer 7 is capable of forming a first intermetallic compound with the first solder, and the material of the adhesive layer 7 may include a nickel alloy (such as any one of a nickel-vanadium alloy, a nickel-aluminum alloy or a nickel-tungsten alloy) or a copper alloy (such as any one of a copper-nickel-titanium alloy, a copper-nickel-aluminum alloy or a copper-magnesium-aluminum alloy). Amass ratio of nickel in the nickel alloy may be greater than 50%. In this case, after the main material layer 211 of the electrical connection layer 21, closest to the base substrate 1, in the first connection pad 2 is completely removed, the first solder can also form the first intermetallic compound with the adhesive layer 7, which may also improve the maintainable rate.

In some embodiments, as shown in FIGS. 1 and 5, the wiring board 10 further includes: a second passivation layer 52 located between the first wiring layer 4 and the second connection pads 3, a third planarization layer 63 located between the second passivation layer 52 and the second connection pads 3, and a fourth planarization layer 64 located on a side of the second connection pads 3 away from the base substrate 1 and covering regions between the second connection pads 3, all of which are disposed in the bonding area B.

The third planarization layer 63 and the first planarization layer 61 are disposed in a same layer, and may constitute a one-piece structure. A material of the third planarization layer 63 and the first planarization layer 61 may be an organic material (e.g., resin), which is used for planarization, and is conducive to fabrication (e.g., fabrication of the first connection pads 2 and the second connection pads 3) in subsequent processes. The fourth planarization layer 64 and the second planarization layer 62 are disposed in a same layer, and may constitute a one-piece structure. A material of the fourth planarization layer 64 and the second planarization layer 62 may be an organic material (e.g., resin), which is used for planarization, and is conducive to fabrication (e.g., fabrication of an overcoat layer 8) in subsequent processes. The second passivation layer 52 and the first passivation layer 51 are disposed in a same layer, and may constitute a one-piece structure. A material of the second passivation layer 52 and the first passivation layer 51 may be silicon oxynitride, silicon nitride, silicon oxide, or the like.

As shown in FIG. 5, a thickness of the second passivation layer 52 may be in a range of 1000 Å to 9000 Å, inclusive.

In some embodiments, the plurality of first connection pads may be divided into a plurality of first connection pad groups. Each first connection pad group is used for connecting an electronic component, and includes a cathode pad and an anode pad that are arranged in a pair. The main material layer included in a first connection pad, which is soldered to the cathode pin of the electronic component, is referred to as the cathode pad; and the main material layer included in a first connection pad, which is soldered to the anode pin of the electronic component, is referred to as the anode pad. As shown in FIG. 4, each first connection pad group includes the cathode pad 211' and the anode pad 211 that are arranged in a pair. Structures of film layers included in the cathode pad 211' and the anode pad 211 are the same.

As shown in FIG. 6, the circuit board 200 is bonded to the second connection pad through a connection portion 40. The circuit board includes a printed circuit board, a flexible circuit board and an integrated circuit chip. A material of the connection portion may be a thermosetting adhesive or an anisotropic conductive adhesive.

During implementation, in the functional backplane provided in embodiments of the present disclosure, as shown in FIGS. 4 and 5, the plurality of first connection pads are divided into the plurality of first connection pad groups, and each first connection pad group includes the cathode pad 211' and the anode pad 211 that are arranged in the pair.

The wiring board 10 further includes a second wiring layer disposed in a same layer as the plurality of first connection pads 2. The second wiring layer is used for achieving series connections or parallel connections between the plurality of first connection pad groups, and the second wiring layer is further used to be electrically connected to the first wiring layer 4 through a via hole penetrating through the first planarization layer 61 and the first passivation layer 51.

As shown in FIGS. 4 and 5, the second wiring layer includes a trace 11 and a trace 12. As shown in FIG. 5, the trace 12 and the first connection pad 2 are of a one-piece structure. The trace 12 and the first connection pad 2 are separated by the dotted line in FIG. 5.

Specific connection manners of the plurality of first connection pad groups are not limited. FIG. 4 is illustrated by considering an example in which two adjacent first connection pad groups are connected in series. As shown in FIGS. 4 and 5, the plurality of first connection pads 2 may be divided into the plurality of first connection pad groups, and each first connection pad group is used for bonding a micro light-emitting diode and includes the cathode pad and the anode pad that are arranged in the pair. The first wiring layer 4 may include the anode trace 44 and the cathode trace 45. Two adjacent first connection pad groups are connected in series through the trace 11. As shown in FIGS. 4 and 5, in the two first connection pad groups that are connected in series, an anode pad of a first connection pad group is connected to a trace 12, the trace 12 is electrically connected to the anode trace 44 through via hole(s) V1 penetrating through the first passivation layer 51 and the first planarization layer 61, and the anode trace 44 is electrically connected to a second connection pad 3 through via hole(s) penetrating through the first passivation layer 51 and the first planarization layer 61; a cathode pad of the other first connection pad group is connected to another trace 12, the another trace 12 is electrically connected to the cathode trace 45 through via hole(s) V1 penetrating through the first passivation layer 51 and the first planarization layer 61, and the cathode trace 45 is electrically connected to another second connection pad 3 through via hole(s) penetrating through the first passivation layer 51 and the first planarization layer 61. In FIG. 4, the cathode pad, the anode pad, the second connection pad 3, the trace 11 and the trace 12 are disposed in the same layer, and the same filling pattern is used for illustrating the cathode pad, the anode pad, the second connection pad 3, the trace 11 and the trace 12; and the anode trace 44 and the cathode trace 45 are disposed in the same layer, and the same filling pattern is used for illustrating the anode trace 44 and the cathode trace 45.

It can be understood that, a driving manner of the functional backplane is not limited in embodiments of the present disclosure. As shown in FIG. 4, the functional backplane may drive a light-emitting unit in a passive manner, or may also provide a signal to the light-emitting unit through a driving circuit that includes thin film transistors, or may also provide a signal to the light-emitting unit through a microchip.

In the case where the signal is provided to the light-emitting unit through the microchip, each microchip includes a plurality of pins, and the wiring board further includes third connection pads located in the device area for bonding the pins of the microchip. A structure of the third connection pad is similar to the structure of the first connection pad, and the third connection pad may be fabricated by using a same film layer structure as the first connection pad. A plurality of electronic components may be divided in a plurality of light regions, and each light region includes at least one electronic component. Each microchip is used for driving electronic component(s) in at least one light region to emit light.

In some embodiments, as shown in FIGS. 5 and 6, the functional backplane provided in the embodiments of the present disclosure further includes the overcoat layer 8 located on a side of the second wiring layer. The overcoat layer 8 exposes the first connection pads 2. A material of the overcoat layer 8 may include silicon oxynitride, silicon nitride or silicon oxide.

Figure 7B:
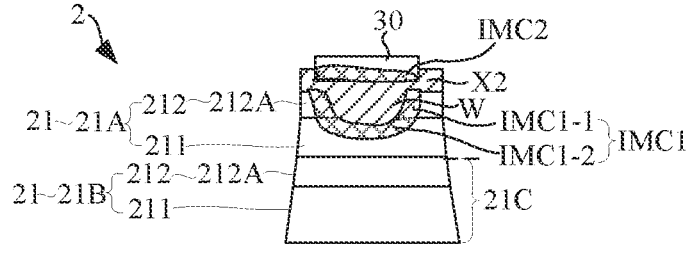
FIG. 7B is yet another structural diagram illustrating a connection between a first connection pad and a pin, in accordance with some embodiments.
Figure 7C:
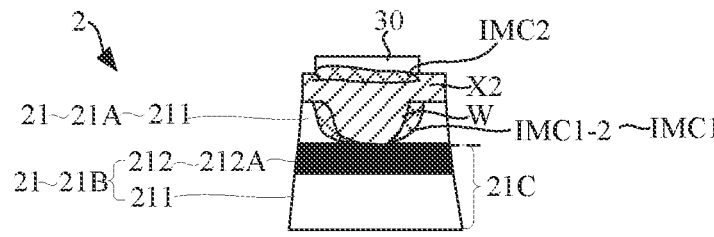
FIG. 7C is yet another structural diagram illustrating a connection between a first connection pad and a pin, in accordance with some embodiments.

In some embodiments, as shown in FIGS. 7A to 7C, in the functional backplane, the plurality of electronic components include at least one first electronic component, in a first connection pad 2 soldered to the pin 30 of the at least one first electronic component, a depression W is formed on a surface, away from the base substrate 1, of the first reference protective layer 212A included in the first electrical connection layer 21A. The depression W is provided with a second solder X2 therein, and the second solder X2 forms the first intermetallic compound IMC1 with at least a sidewall of the depression W.

In these embodiments, the first reference protective layer 212A included in the first electrical connection layer 21A is a protective layer 212 of the first connection pad 2 farthest away from the base substrate 1. In this case, according to whether the number of the electrical connection layers 21 is one or more, and a bottom of the depression W is in direct contact with the main material layer 211 or in direct contact with a protective layer 212, there are different cases.

Here, the second solder X2 forming the first intermetallic compound IMC1 with at least the sidewall of the depression W is described by considering an example in which the number of the electrical connection layers 21 is two, and each electrical connection layer 21 includes the main material layer 211 and one protective layer 212 (i.e., the first reference protective layer 212A included in the first electrical connection layer 21A and the first reference protective layer 212A included in the second electrical connection layer 21B).

In a first case, as shown in FIG. 7A, materials of protective layers 212 included in the two electrical connection layers 21 are each selected from a material that is capable of forming the first intermetallic compound with the first solder. After a first soldering, the first solder forms the first intermetallic compound with the protective layer 212A included in the electrical connection layer 21 (i.e., the first electrical connection layer 21A) farthest away from the base substrate, and the thickness of the first intermetallic compound is less than the thickness of the protective layer 212A included in the upper electrical connection layer 21. In a case where a pseudo soldering or offset of the electronic component occurs, the first intermetallic compound is also removed while the electronic component is removed. In this case, the depression W is formed on the surface of the protective layer 212A included in the electrical connection layer 21A away from the base substrate 1, and the protective layer 212A included in the electrical connection layer 21A is still retained. That is, the sidewall and the bottom of the depression W are all located in the protective layer 212A. In this case, by providing the second solder X2 in the depression W, the second solder X2 continues to form the first intermetallic compound IMC1-1 with the sidewall and the bottom of the depression W (i.e., the protective layer 212A). Therefore, it is possible to achieve the maintenance by soldering a pin 30 of a new electronic component to the first connection pad 2.

In a second case, as shown in FIG. 7B, the materials of the protective layers 212 included in the two electrical connection layers 21 (i.e., the first reference protective layer 212A included in the first electrical connection layer 21A and the first reference protective layer 212A included in the second electrical connection layer 21B) each are capable of forming the first intermetallic compound with the first solder. After the first soldering, the first solder forms the first intermetallic compound with the protective layer 212A included in the electrical connection layer 21 farthest away from the base substrate 1 and forms the first intermetallic compound with the main material layer 211 included in the upper electrical connection layer 21, and the thickness of the first intermetallic compound formed by the first solder and the main material layer 211 included in the upper electrical connection layer 21 is less than the thickness of the main material layer 211. In the case where the pseudo soldering or offset of the electronic component occurs, after the electronic component is removed, the depression W is formed on surfaces, away from the base substrate 1, of the protective layer 212A and the main material layer 211 that are included in the electrical connection layer 21A. The bottom of the depression W is located in the main material layer 211, and the sidewall of the depression W is located in both retained protective layer 212A and retained main material layer 211. In this case, by providing the second solder X2 in the depression W, the second solder X2 continues to react with the sidewall of the depression W (i.e., the protective layer 212A included in the electrical connection layer 21A) and the bottom of the depression W (i.e., the main material layer 211 included in the electrical connection layer 21A), so as to form the first intermetallic compound IMC1-1 and the first intermetallic compound IMC1-2, respectively. Therefore, it is possible to achieve the maintenance by soldering the pin 30 of the new electronic component to the first connection pad 2.

In a third case, as shown in FIG. 7C, the material of the protective layer included in the upper electrical connection layer 21 (i.e., the first reference protective layer included in the first electrical connection layer 21A) of the two electrical connection layers 21 is capable of forming the first intermetallic compound with the first solder, and the material of the protective layer 212 included in the lower electrical connection layer 21 (i.e., the first reference protective layer 212A included in the second electrical connection layer 21B) is not capable of forming the first intermetallic compound with the first solder. For example, the material of the protective layer 212 may be a molybdenum-niobium alloy. After the first soldering, the first solder forms the first intermetallic compound with the protective layer and the main material layer 211 that are included in the upper electrical connection layer 21, and the thickness of the first intermetallic compound is equal to a sum of the thicknesses of the protective layer and the main material layer 211 that are included in the upper electrical connection layer 21. In the case where the pseudo soldering or offset of the electronic component occurs, after the electronic component is removed, if the protective layer included in the upper electrical connection layer 21 is completely removed, and the bottom of the depression W is located in the lower electrical connection layer 21, then the sidewall of the depression W is located in the retained main material layer 211. By providing the second solder X2 in the depression W, the second solder X2 continues to form the first intermetallic compound IMC1-2 with the sidewall of the depression W (i.e., a portion of the main material layer 211 included in the upper electrical connection layer 21). Therefore, it is possible to achieve the maintenance by soldering the pin 30 of the new electronic component to the first connection pad 2.

In these embodiments, in the first connection pad 2 soldered to the pin 30 included in the at least one first electronic component, the depression W is formed on the surface of the first reference protective layer 212A included in the first electrical connection layer 21A away from the base substrate 1, and the depression W is formed by removing the first intermetallic compound in the first connection pad 2. By selecting the thickness and material of the protective layer 212 included in the electrical connection layer 21, it may be possible to form the depression W on the surface of the first reference protective layer 212A included in the first electrical connection layer 21A away from the base substrate 1 by removing the electronic component when poor soldering occurs, and at least the sidewall of the depression W is retained to be of a material capable of forming the first intermetallic compound IMC1 with the second solder. Therefore, the second solder X2 forms the first intermetallic compound IMC1 with at least the sidewall of the depression W during maintenance. Materials of the second solder X2 and the first solder may be the same. For example, the materials each are an alloy whose base material is tin, e.g., a tin-silver-copper alloy. Alternatively, the material of the second solder X2 may be a material capable of forming the first intermetallic compound IMC1 with the first reference protective layer 212A and the main material layer 211 included in the first electrical connection layer 21A.

In some embodiments, as shown in FIGS. 7A to 7C, the at least one electrical connection layer 21 further includes the third electrical connection layer 21C, and the third electrical connection layer 21C is an electrical connection layer 21 closest to the base substrate 1 in the at least one electrical connection layer 21. A portion of the first connection pad 2 located on a side of the bottom of the depression W includes at least a portion included in the third electrical connection layer 21C in the first connection pad 2, and the portion included in the third electrical connection layer 21C includes at least a portion of the main material layer 211 included in the third electrical connection layer 21C.

In a case where the number of the electrical connection layers 21 is one, the third electrical connection layer 21C is the first electrical connection layer 21A. In a case where the number of the electrical connection layers 21 is two, the third electrical connection layer 21C is the second electrical connection layer 21B.

In these embodiments, the portion of the first connection pad 2 located on the side of the bottom of the depression W includes the portion included in the third electrical connection layer 21C, which means that, after the maintenance, at least part of the main material layer 211 included in the third electrical connection layer 21C in the first connection pad 2 is retained, and a situation that the main material layer 211 located at the bottom of the first connection pad 2 is completely removed will not occur. Therefore, it may be possible to avoid that only the adhesive layer is retained, and thus avoid that a poor maintenance occurs because a material of the adhesive layer cannot form the first intermetallic compound with the first solder.

Some embodiments of the present disclosure provide a method for manufacturing a functional backplane. As shown FIG. 8, the method includes following steps (S1 and S2).

In S1, a wiring board 10 is fabricated. The wiring board 10 includes a base substrate 1 and a plurality of first connection pads 2. The base substrate 1 has a device area A, and the plurality of first connection pads 2 are located in the device area A. The plurality of first connection pads 2 each include at least one electrical connection layer 21. Each electrical connection layer 21 includes a main material layer 211 and at least one protective layer 212 disposed on a side of the main material layer 211 away from the base substrate 1. The at least one protective layer 212 includes a first reference protective layer 212A. The first reference protective layer 212A is a protective layer 212 farthest away from the base substrate 1 in the at least one protective layer 212. A material of the main material layer 211 includes copper. The at least one electrical connection layer 21 includes a first electrical connection layer 21A, and the first electrical connection layer 21A is an electrical connection layer 21 farthest away from the base substrate 1 in the at least one electrical connection layer 21. In the at least one protective layer 212 included in the first electrical connection layer 21A, at least a material of the first reference protective layer 212A is capable of forming a first intermetallic compound with the first solder.

The method for manufacturing the wiring board includes following steps (step 1 to step 5).

In step 1, a first metal sub-layer 41, a first wiring sub-layer 42 and a second metal sub-layer 43 are formed on the base substrate 1. Materials of the first metal sub-layer 41 and the second metal sub-layer 43 may each be an alloy containing molybdenum, which has adhesion and oxidation resistance. The first metal sub-layer 41 and the second metal sub-layer 43 may each be fabricated through a sputtering process, and thicknesses of the first metal sub-layer 41 and the second metal sub-layer 43 each are in a range of several hundred angstroms to several thousand angstroms. A material of the first wiring sub-layer 42 may be copper, and a thickness of the first wiring sub-layer 42 may be in a range of 1 µm to 5 µm, inclusive. The first wiring sub-layer 42 may be formed through a sputtering or electroplating process.

Of course, the first metal sub-layer 41, the first wiring sub-layer 42 and the second metal sub-layer 43 may also be formed by continuous deposition and patterning.

In step 2, a first passivation layer (SiN) 51 is deposited, and then patterned to form via holes. A thickness of the first passivation layer 51 is in a range of 1000 Å to 4000 Å, inclusive.

In step 3, a first planarization layer 61 is formed on the base substrate 1 on which the first passivation layer 51 is formed, and then patterned to form via holes.

In step 4, an adhesive layer 7, a second wiring layer and the at least one electrical connection layer are formed. Each electrical connection layer 21 includes the main material layer 211 and the at least one protective layer 212. The at least one electrical connection layer 21 includes the first electrical connection layer 21A. The at least one protective layer 212 includes the first reference protective layer 212A, and the first reference protective layer 212A is the protective layer 212 farthest away from the base substrate 1 in the at least one protective layer 212. The material of the first reference protective layer 212A included in the first electrical connection layer 21A is capable of forming the first intermetallic compound with the first solder. A material of the main material layer 211 includes metal copper. The adhesive layer 7 is electrically connected to the second metal sub-layer 43 through via hole(s) penetrating through the first passivation layer 51 and first planarization layer 61.

In step 5, a second passivation layer 52, a second planarization layer 61 and an overcoat layer 8 are deposited, and then patterned to expose the first connection pad 2.

In S2, at least one electronic component 20 is provided. Each electronic component 20 includes pins 30. The at least one electronic component 20 is soldered to the first connection pads 2 through the pins 30 and the first solder X1. The first solder X1 forms the first intermetallic compound with at least the first reference protective layer 212A included in the first electrical connection layer 21A in each first connection pad 2, and the first solder forms a second intermetallic compound with the pin 30.

Figure 8:
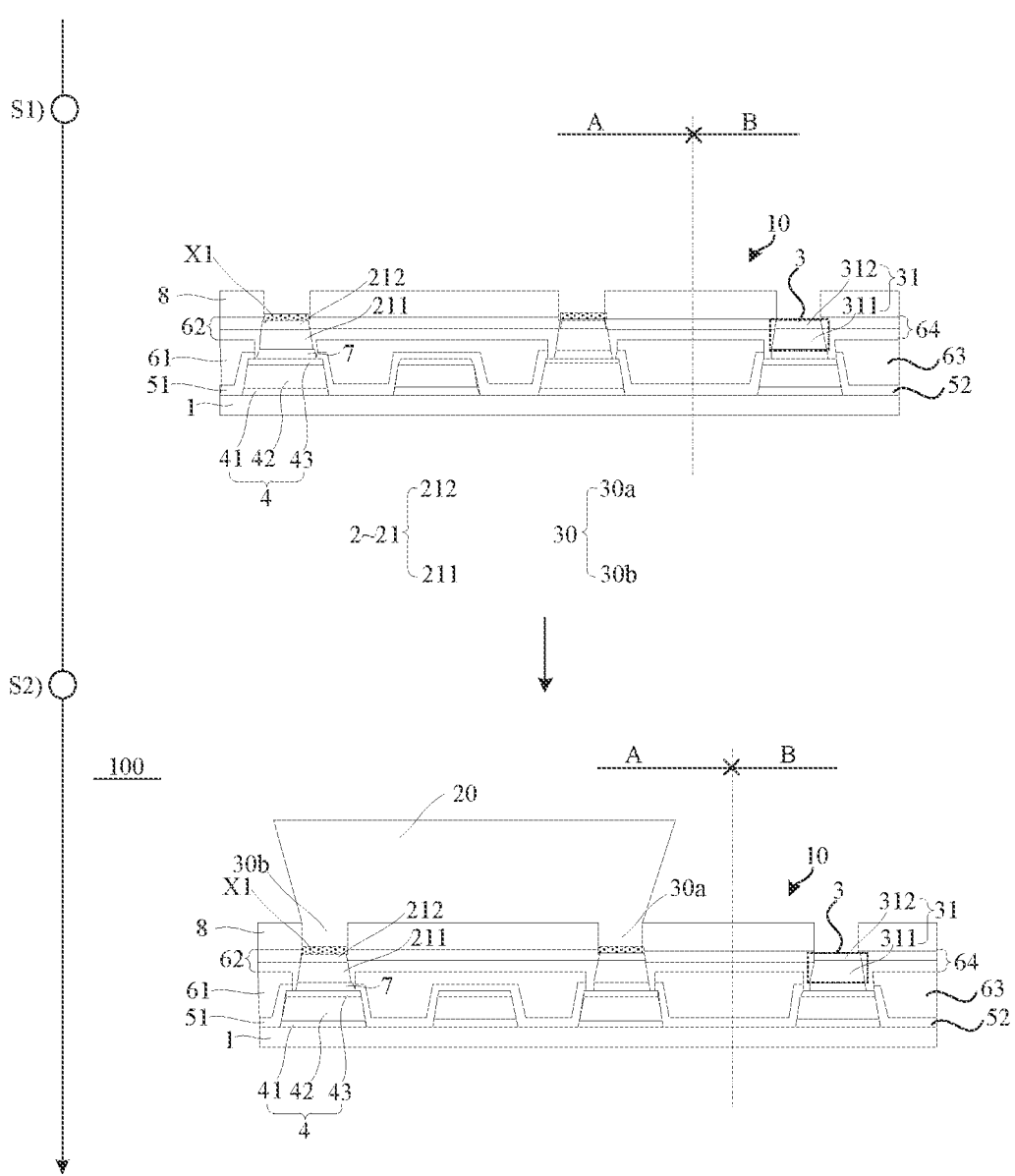
FIG. 8 is a flow diagram of a method for manufacturing a functional backplane, in accordance with some embodiments.
Figure 9:
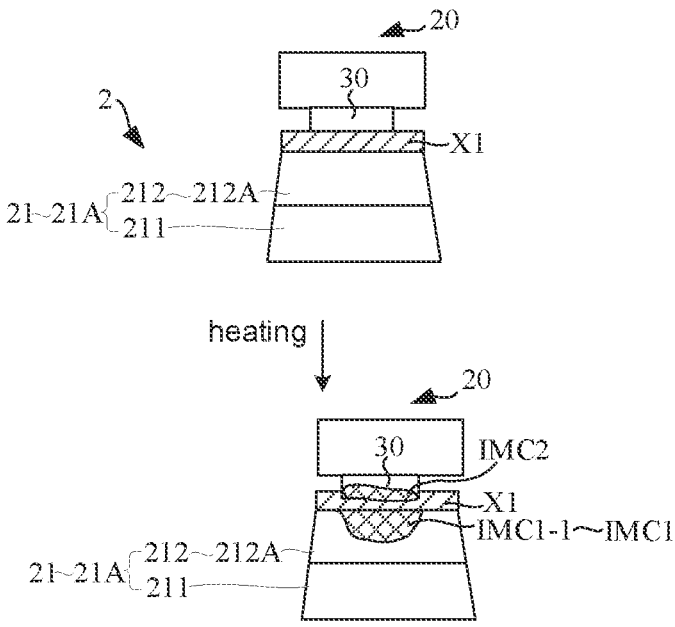
FIG. 9 is a flow diagram illustrating a first solder forming a first intermetallic compound with at least a first reference protective layer, in accordance with some embodiments.

In some embodiments, as shown in FIGS. 8 and 9, soldering the at least one electronic component 20 to the first connection pads 2 through the pins 30 and the first solder X1, includes:

providing the first solder X1 between the pins 30 included in each electronic component 20 and the first connection pads 2, and making the first solder X1 react with the first connection pads 2 and the pins 30, so as to solder the at least one electronic component 20 to the first connection pads 2 through the pins 30 and the first solder X1.

The first solder X1 may react with the first connection pad 2 and the pin 30 at a high temperature. A reflow soldering process may be used, and in this case, the first solder X1 may form the first intermetallic compound IMC1 (e.g., IMC1–1) with at least the first reference protection layer 212A in the first electrical connection layer 21A included in the first connection pad 2, and the first solder X1 and the pin 30 form the second intermetallic compound IMC2, so that the first connection pad 2 and the pin 30 may be soldered together.

After the reaction is completed, there may be an unreacted first solder X1 retained between the first intermetallic compound IMC1 and the second intermetallic compound IMC2, or there is no first solder X1 retained. That is, the first solder X1 is completely diffused to the first connection pad 2 and the pin 30, and forms the first intermetallic compound IMC1 and the second intermetallic compound IMC2 with the first connection pad 2 and the pin 30, respectively.

Figure 10:
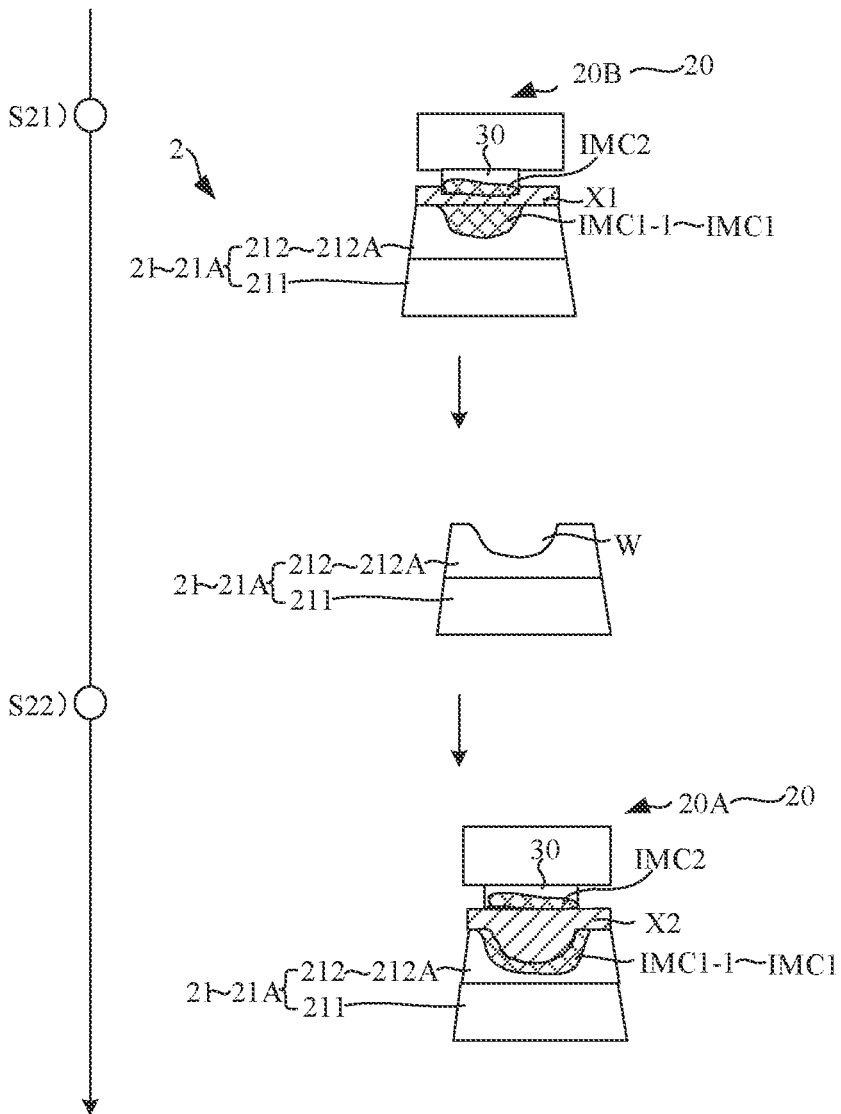
FIG. 10 is a flow diagram of replacing a second electronic component with a first electronic component, in accordance with some embodiments.

In some embodiments, as shown in FIG. 10, in a case where the at least one electronic component 20 includes at least one first electronic component, the manufacturing method further includes following steps.

A state of a connection between the at least one electronic component 20 and the wiring board 10 is detected.

That is, whether an electrical connection between the at least one electronic component 20 and the wiring board 10 is a pseudo soldering or whether an offset of the at least one electronic component 20 occurs may be detected.

If the state of the connection between a second electronic component and the wiring board 10 does not meet a requirement, the second electronic component is replaced with the first electronic component.

The state of the connection between the second electronic component and the wiring board 10 does not meet the requirement, which means that, the pseudo soldering occurs between the second electronic component and the wiring board 10 or the offset of the second electronic component occurs. In this case, the second electronic component is replaced. That is, the second electronic component is maintained.

In some embodiments, as shown in FIG. 10, replacing the second electronic component with the first electronic component may include following steps (S21 and S22).

In S21, the second electronic component 20B is removed to form a depression W on a surface of the first connection pad 2 away from the base substrate 1.

For example, a lateral shear force may be applied to the second electronic component 20B to remove the second electronic component 20B. In this process, a portion, which forms the first intermetallic compound IMC1 (e.g., IMC1–1) with the first solder X1, of the first connection pad 2 is also removed, so that the depression W is formed on the surface of the first connection pad 2 away from the base substrate 1.

In S22, the second solder X2 is provided in the depression W, and the pin 30 included in the first electronic component 20A is soldered to the first connection pad 2 through the second solder X2. The second solder X2 forms the first intermetallic compound IMC1 with at least a sidewall of the depression W.

According to whether a bottom of the depression W is in direct contact with the main material layer 211 or the protective layer 212, and whether the bottom of the depression W is capable of forming the first intermetallic compound IMC1 with the second solder X2, the second solder X2 may form the first intermetallic compound IMC1 with the sidewall of the depression W, or the second solder X2 may form the first intermetallic compound IMC1 with both the sidewall and the bottom of the depression W. As for details, reference may be made to the above descriptions in which the number of the electrical connection layers 21 is two, and the second solder X2 forms the first intermetallic compound IMC1 with at least the sidewall of the depression W, which will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A wiring board, comprising:

a base substrate; and a plurality of first connection pads disposed on the base substrate;

wherein the plurality of first connection pads each include at least one electrical connection layer; each electrical connection layer includes a main material layer and at least one protective layer disposed on a side of the main material layer away from the base substrate; the at least one protective layer includes a first reference protective layer, the first reference protective layer is a protective layer farthest away from the base substrate in the at least one protective layer; and a material of the main material layer includes copper;

the at least one electrical connection layer includes a first electrical connection layer and a second electrical connection layer; wherein the first electrical connection layer is an electrical connection layer farthest away from the base substrate in the at least one electrical connection layer; and in at least one protective layer included in the first electrical connection layer, at least a material of the first reference protective layer is capable of forming a first intermetallic compound with a first solder; the first electrical connection layer is located on a side of the first solder proximate to the base substrate; and the second electrical connection layer is located between the first electrical connection layer and the base substrate; a material of a first reference protective layer included in the second electrical connection layer is capable of forming another first intermetallic compound with the first solder, or the material of the first reference protective layer included in the second electrical connection layer is not capable of forming the another first intermetallic compound with the first solder.

2. The wiring board according to claim 1, wherein the material of the first reference protective layer included in the first electrical connection layer is a metal simple substance or a metal alloy.

3. The wiring board according to claim 2, wherein in a case where the material of the first reference protective layer included in the first electrical connection layer is the metal simple substance, the metal simple substance includes any one of Cu, Ni, Fe, Ag and Au; and in a case where the material of the first reference protective layer included in the first electrical connection layer is the metal alloy, the metal alloy includes a nickel alloy or a copper alloy; or in a case where the material of the first reference protective layer included in the first electrical connection layer is the metal alloy, and the metal alloy includes the nickel alloy, the nickel alloy includes any one of a nickel-vanadium alloy, a nickel-aluminum alloy, a nickel-tungsten alloy, a copper-nickel-titanium alloy and a copper-nickel-aluminum alloy.

4. The wiring board according to claim 1, wherein a thickness or a material of the at least one protective layer included in the first electrical connection layer is configured to block diffusion of the first solder to a main material layer included in the first electrical connection layer.

5. The wiring board according to claim 4, wherein in a case where the material of the first reference protective layer included in the first electrical connection layer includes copper or a copper-nickel alloy, a thickness of the first reference protective layer included in the first electrical connection layer is in a range of 300 Å to 600 Å, inclusive; and in a case where the material of the first reference protective layer included in the first electrical connection layer does not include copper, the thickness of the first reference protective layer included in the first electrical connection layer is in a range of 300 Å to 3000 Å, inclusive; or in the case where the material of the first reference protective layer included in the first electrical connection layer includes copper or the copper-nickel alloy, the thickness of the first reference protective layer included in the first electrical connection layer is in the range of 300 Å to 600 Å, inclusive; and in the case where the material of the first reference protective layer included in the first electrical connection layer does not include copper, the thickness of the first reference protective layer included in the first electrical connection layer is in the range of 300 Å to 3000 Å, inclusive; and a diffusion depth of the first solder in the at least one protective layer included in the first electrical connection layer is greater than or equal to the thickness of the first reference protective layer included in the first electrical connection layer.

6. The wiring board according to claim 1, wherein the at least one protective layer included in the first electrical connection layer includes at least two protective layers, the at least two protective layers include the first reference protective layer and a second reference protective layer, the second reference protective layer is located between the first reference protective layer and the base substrate; and a material of the second reference protective layer is capable of forming another first intermetallic compound with the first solder, or the material of the second reference protective layer is not capable of forming the another first intermetallic compound with the first solder.

7. The wiring board according to claim 6, wherein the material of the second reference protective layer is capable of forming the another first intermetallic compound with the first solder; and materials of the at least two protective layers are different, or a thickness of at least one protective layer in the at least two protective layers is greater than 500 Å, or a sum of thicknesses of the at least two protective layers is greater than 500 Å.

8. The wiring board according to claim 7, wherein the materials of the at least two protective layers being different, includes that:

elements included in the at least two protective layers are different; or the at least two protective layers include same elements and a ratio of the elements is different; or the at least two protective layers include same base elements and a ratio of the base elements is same, and the at least one protective layer in the at least two protective layers further includes a dopant material doped in the base elements included in the at least one protective layer in the at least two protective layers.

9. The wiring board according to claim 7, wherein in a direction pointing from a first connection pad in the plurality of first connection pads to the base substrate, a diffusion depth of the first solder in the at least two protective layers per unit time gradually decreases; and/or melting points of the materials of the at least two protective layers gradually increase; and/or in the direction pointing from the first connection pad in the plurality of first connection pads to the base substrate, a ratio of an element capable of forming the first intermetallic compound with the first solder in the at least two protective layers gradually decreases.

10. The wiring board according to claim 7, wherein in a direction pointing from a first connection pad in the plurality of first connection pads to the base substrate, thicknesses of the at least two protective layers gradually increase; or in the direction pointing from the first connection pad in the plurality of first connection pads to the base substrate, the thicknesses of the at least two protective layers gradually increase; and a thickness of the second reference protective layer is greater than or equal to 1000 Å and less than or equal to 30000 Å, and a thickness of the first reference protective layer is greater than or equal to 300 Å and less than or equal to 1000 Å.

11. The wiring board according to claim 7, wherein a diffusion depth of the first solder in the at least one protective layer included in the first electrical connection layer is greater than or equal to a thickness of the first reference protective layer included in the first electrical connection layer, and less than or equal to a sum of the thickness of the first reference protective layer included in the first electrical connection layer and a thickness of the second reference protective layer.

12. The wiring board according to claim 1, wherein the material of the first reference protective layer included in the second electrical connection layer is capable of forming the another first intermetallic compound with the first solder; and a thickness of the first reference protective layer included in the second electrical connection layer is greater than a thickness of the first reference protective layer included in the first electrical connection layer; or the material of the first reference protective layer included in the second electrical connection layer is capable of forming the another first intermetallic compound with the first solder; and the thickness of the first reference protective layer included in the second electrical connection layer is greater than the thickness of the first reference protective layer included in the first electrical connection layer; and the thickness of the first reference protective layer included in the second electrical connection layer is greater than or equal to 1000 Å and less than or equal to 30000 Å, and the thickness of the first reference protective layer included in the first electrical connection layer is greater than or equal to 300 Å and less than or equal to 1000 Å.

13. The wiring board according to claim 1, wherein a diffusion depth of the first solder in the at least one electrical connection layer is greater than or equal to a thickness of the first reference protective layer included in the first electrical connection layer, and less than or equal to a sum of a thickness of the first electrical connection layer and a thickness of the first reference protective layer included in the second electrical connection layer.

14. The wiring board according to claim 1, further comprising a plurality of second connection pads disposed on the base substrate, the plurality of second connection pads being configured to be electrically connected to a circuit board.

15. A functional backplane, comprising:

the wiring board according to claim 1 and the first solder; and at least one electronic component, each electronic component including pins, and the electronic component being soldered to first connection pads in the plurality of first connection pads through the pins and the first solder;

wherein the first solder forms the first intermetallic compound with at least the first reference protective layer included in the first electrical connection layer in each of the first connection pads.

16. The functional backplane according to claim 15, wherein the at least one electronic component includes at least one first electronic component; in a first connection pad soldered to a pin included in the at least one first electronic component, a surface, away from the base substrate, of the first reference protective layer included in the first electrical connection layer has a depression; the depression is provided with a second solder therein, and the second solder forms the first intermetallic compound with at least a sidewall of the depression; or the at least one electronic component includes the at least one first electronic component; in the first connection pad soldered to the pin included in the at least one first electronic component, the surface, away from the base substrate, of the first reference protective layer included in the first electrical connection layer has the depression; the depression is provided with the second solder therein, and the second solder forms the first intermetallic compound with at least the sidewall of the depression;

the at least one electrical connection layer further includes a third electrical connection layer, and the third electrical connection layer is an electrical connection layer closest to the base substrate in the at least one electrical connection layer; and a portion of the first connection pad located on a side of a bottom of the depression includes at least a portion included in the third electrical connection layer in the first connection pad, and the portion included in the third electrical connection layer includes at least a portion of a main material layer included in the third electrical connection layer.

17. A method for manufacturing a functional backplane, comprising:

fabricating a wiring board, wherein the wiring board includes a base substrate and a plurality of first connection pads; the plurality of first connection pads are formed on the base substrate; the plurality of first connection pads each include at least one electrical connection layer, and each electrical connection layer includes a main material layer and at least one protective layer disposed on a side of the main material layer away from the base substrate; the at least one protective layer includes a first reference protective layer, and the first reference protective layer is a protective layer farthest away from the base substrate in the at least one protective layer; a material of the main material layer includes copper; the at least one electrical connection layer includes a first electrical connection layer and a second electrical connection layer, wherein the first electrical connection layer is an electrical connection layer farthest away from the base substrate in the at least one electrical connection layer; and in at least one protective layer included in the first electrical connection layer, at least a material of the first reference protective layer is capable of forming a first intermetallic compound with a first solder; the first electrical connection layer is located on a side of the first solder proximate to the base substrate; and the second electrical connection layer is located between the first electrical connection layer and the base substrate; a material of a first reference protective layer included in the second electrical connection layer is capable of forming another first intermetallic compound with the first solder, or the material of the first reference protective layer included in the second electrical connection layer is not capable of forming the another first intermetallic compound with the first solder;

providing at least one electronic component, each electronic component including pins; and soldering the electronic component to first connection pads in the plurality of first connection pads through the pins and the first solder, wherein the first solder forms the first intermetallic compound with at least the first reference protective layer included in the first electrical connection layer in each of the first connection pads, and the first solder forms a second intermetallic compound with a pin in the pins.

18. The method for manufacturing the functional backplane according to claim 17, wherein soldering the electronic component to the first connection pads in the plurality of first connection pads through the pins and the first solder includes:

providing the first solder between the pins included in each electronic component and the first connection pads, and making the first solder react with the first connection pads and the pins, so as to solder the electronic component to the first connection pads through the pins and the first solder.

19. The method for manufacturing the functional backplane according to claim 17, wherein in a case where the at least one electronic component includes a plurality of electronic components, and the plurality of electronic components include at least one first electronic component, the manufacturing method further comprises:

detecting states of connections between the plurality of electronic components and the plurality of first connection pads; and if a state of a connection between a second electronic component and a first connection pad does not meet a requirement, replacing the second electronic component with a first electronic component in the at least one first electronic component; or in the case where the at least one electronic component includes the plurality of electronic components, the plurality of electronic components include the at least one first electronic component, the manufacturing method further comprises:

detecting the states of connections between the plurality of electronic components and the plurality of first connection pads; and if the state of the connection between the second electronic component and the first connection pad does not meet the requirement, replacing the second electronic component with the first electronic component in the at least one first electronic component;

wherein replacing the second electronic component with the first electronic component in the at least one first electronic component includes:

removing the second electronic component to form a depression on a surface of the first connection pad away from the base substrate; and providing a second solder in the depression, and soldering a pin included in the first electronic component to the first connection pad through the second solder, wherein the second solder forms the first intermetallic compound with at least a sidewall of the depression.

* * * * *